(12) United States Patent
Ker et al.

(10) Patent No.: US 6,465,768 B1
(45) Date of Patent: Oct. 15, 2002

(54) MOS STRUCTURE WITH IMPROVED SUBSTRATE-TRIGGERED EFFECT FOR ON-CHIP ESD PROTECTION

(75) Inventors: Ming-Dou Ker; Tung-Yang Chen; Tien-Hao Tang, all of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,344

(22) Filed: Aug. 22, 2001

(51) Int. Cl.⁷ .............................................. H01L 31/00
(52) U.S. Cl. .................................... 250/214.1; 257/355
(58) Field of Search .......................... 250/214.1, 214 A, 250/214 LA, 208.1, 216; 257/290, 291, 355, 356, 378, 357, 431–433

(56) References Cited

U.S. PATENT DOCUMENTS 6,399,990 B1 * 6/2002 Brennan et al. ............ 257/355

* cited by examiner

*Primary Examiner*—Que T. Le
(74) *Attorney, Agent, or Firm*—Winston Hsu

(57) ABSTRACT

An ESD protection device is formed on a P-type well, and has at least one NMOS, at least one first P⁺ diffusion region for electrically connecting to a P-well biasing circuit, at least one dummy gate between the NMOS and the first P⁺ diffusion region, at least one second P⁺ diffusion region for electrically connecting to a $V_{SS}$ power terminal, and at least one shallow trench isolation (STI) structure for isolating the NMOS and the second P⁺ diffusion region. A drain of the NMOS, the P-type well, and a source of the NMOS form a parasitic lateral n-p-n bipolar junction transistor (BJT), and the drain and the source of the NMOS are electrically connected to an I/O buffering pad and a $V_{SS}$ power terminal respectively. When an ESD voltage pulse zaps the I/O buffering pad, the P-well biasing circuit induces a substrate trigger current ($I_{trig}$), causing the parasitic lateral n-p-n BJT to trigger on and quickly discharge a current incurred from the ESD voltage pulse.

40 Claims, 17 Drawing Sheets

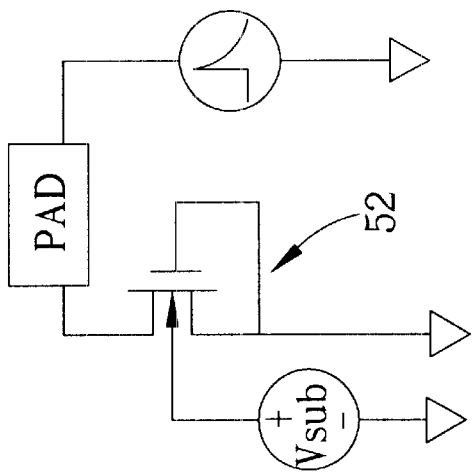
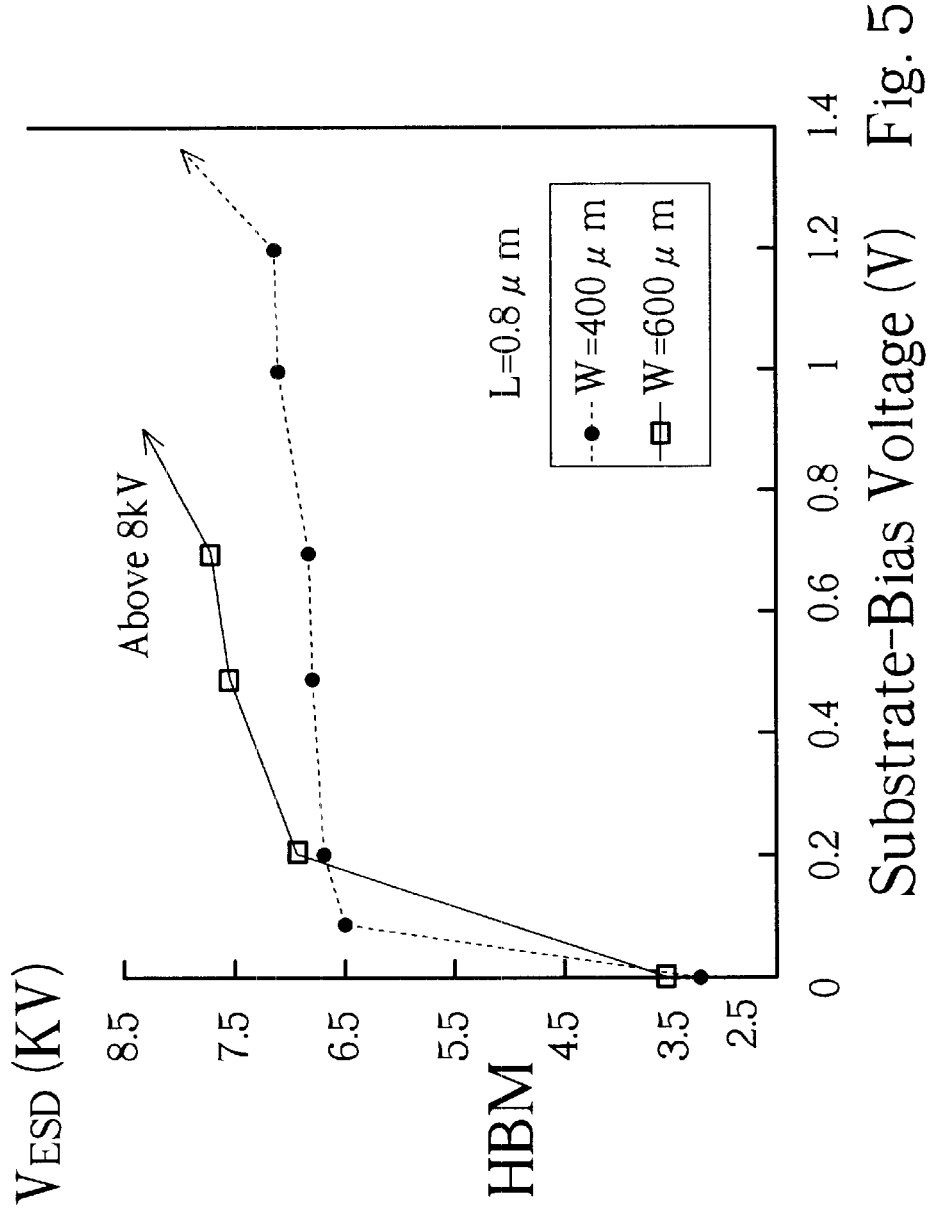
Fig. 5

MOS STRUCTURE WITH IMPROVED SUBSTRATE-TRIGGERED EFFECT FOR ON-CHIP ESD PROTECTION

BACKGROUND OF INVENTION

1. Field of the Invention

The present invention provides an electrostatic discharge (ESD) protection device and related circuit. In particular, an ESD protection device with a high substrate-triggered effect is disclosed.

2. Description of the Prior Art

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron CMOS technologies. All of these processes cause the related CMOS IC products to become more susceptible to electrostatic discharge (ESD) damage. Therefore, ESD protection circuits are built onto the chip to protect the devices and circuits of the IC against ESD damage. It is generally desired that the ESD robustness for commercial IC products be higher than 2 kV in human-body-model (HBM) ESD stress. To sustain ESD overstress, devices with large dimensions need to be designed into the on-chip ESD protection circuit, and require a large total layout area on the silicon substrate.

Typically, an NMOS in an I/O ESD protection circuit has a total channel width that is greater than 300 $\mu$m. With such large device dimensions, the NMOS is often realized with multiple fingers in the layout. However, under an ESD stress, the multiple fingers of ESD protection NMOS do not uniformly turn on to bypass the ESD current. Only a portion of the fingers of the NMOS may be turned on, and consequently leading to damage from the ESD pulse. In this case, although the ESD protection NMOS has a very large device dimension, the ESD protection level is low.

In order to improve the turn-on uniformity among the multiple fingers, a gate-driven design has been used to increase the ESD protection level of the large-device-dimension ESD protection NMOS. However, it has been found that the ESD protection level of the gate-driven NMOS decreases dramatically when the gate voltage is somewhat increased. The gate-driven design pulls ESD current flowing through the channel surface of the NMOS rather than the bulk. The NMOS is thus more easily burnt-out by the ESD energy.

Please refer to FIG. 1. FIG. 1 is a schematic circuit diagram of a traditional ESD protection design using the gate-driven technique. Since all ESD protection designs using the gate-driven technique have the same basic idea, they may be generally illustrated as disclosed in FIG. 1. As shown in FIG. 1, the ESD protection circuit design 10 comprises an ESD protection NMOS 12. The NMOS 12 comprises a source 13, a drain 14 and a gate 16. The drain 14 of the NMOS 12 is electrically connected to a pad 18. The gate 16 is biased by a gate-biasing circuit 20. The gate-biasing circuit 20 is typically designed with a coupled capacitor (not shown) electrically connected from the pad 18 to the gate, and a resistor(not shown) electrically connected from the gate 16 to a $V_{SS}$ power terminal. Additionally, an internal circuit 22 is electrically connected to the pad 18 through a conductor 23.

When a positive ESD voltage zaps the pad 18, a sharp-rising ESD voltage pulse is coupled to the gate 16 of the ESD protection NMOS 12. The ESD protection NMOS 12 is thus turned on to discharge the ESD current from the pad 18 to the $V_{SS}$ power terminal. This is the so-called gate-coupled design or gate-driven design. The gate bias improves the turn-on uniformity of the multiple fingers of the ESD protection NMOS, but an excessive gate bias also causes the ESD current to flow through the inversion layer of the surface channel of the ESD protection NMOS 12, which can burn out the channel of the NMOS 12.

Please refer to FIG. 2. FIG. 2 is a schematic diagram of an ESD current path flowing through a gate-driven NMOS device. As shown in FIG. 2, an ESD protection NMOS device 30 comprises a P substrate 31, a P-well 32 in the P substrate 31, and an NMOS transistor 34 in the P-well 32. The NMOS transistor 34 comprises a source 35, a drain 36 and a doped polysilicon gate 37. Two lightly doped drains (LDD) 38 are adjacent to the source 35 and drain 36, respectively. The source 35 region is electrically connected to a $V_{SS}$ power terminal, the drain 36 region is electrically connected to a pad 40, and the gate 37 region is electrically connected to a gate-biasing circuit 42. In FIG. 2, ESD damage is often located at the surface channel close to the LDD 38 edge of the drain 36.

The gate-biasing circuit 42 generates a high voltage ($V_G$) to bias the gate 37 of the NMOS transistor 34 during positive ESD zapping events. The generated $V_G$ gate voltage turns on the surface channel of the NMOS. A surface channel of the NMOS 34 having a structure with a much shallower junction depth and smaller volume is more susceptible to ESD damage. Not only may burn-out occur because of overheating, but the NMOS 34 may also be damaged by ESD. The ESD damage is often located at the surface channel close to the LDD 38 corner of the drain 36. A large ESD current (typically 1.33 Amp, for a 2 kV HMB ESD event), flowing through the very shallow surface channel of the NMOS transistor 34, often burns out the NMOS transistor 34 even if the NMOS 34 has large device dimensions.

Please refer to FIG. 3. FIG. 3 illustrates experimental results of the dependence between gate-biasing voltage and HBM ESD protection level of the NMOS 12 device in a 0.35 $\mu$m silicide CMOS process. As shown in FIG. 3, the HBM ESD protection level of the NMOS 12 is initially increased when the gate-biasing voltage increases. But the HBM ESD protection level of the NMOS design decreases sharply when the gate-biasing voltage exceeds a critical voltage level. The ESD protection NMOS 12 in FIG. 3 has a fixed channel length of 0.8 $\mu$m. The HBM ESD level of the ESD protection NMOS 12, with W=600 $\mu$m, begins to sharply decrease when the gate-biasing voltage is increased beyond about 8.5V. Because of this, the gate-driven design is no longer suitable for use to improve ESD robustness in sub-quarter-micron CMOS technologies.

Please refer to FIG. 4. FIG. 4 is a schematic circuit diagram of another prior art ESD protection design 50 using a substrate-triggered technique. As shown in FIG. 4, the ESD protection circuit design 50 comprises an NMOS 52, an internal circuit 62, a pad 58, a substrate-biasing circuit 60, and a conductor for electrically connecting the internal circuit 62 with the pad 58. The NMOS 52 further comprises a source 53, a drain 54 electrically connected to the pad 58, a gate 55, and a substrate 56 biased by the substrate-biasing circuit 60.

When a positive ESD voltage zaps the pad 58, the bulk (substrate) of the ESD protection NMOS 52 is biased at some voltage level generated by the substrate-biasing circuit 60. With the substrate-biasing voltage, parasitic lateral n-p-n bipolar junction transistor (BJT) 64 effects in the NMOS 52 are triggered on to discharge the ESD current. In this substrate-triggered technique, the ESD current flowing through the NMOS 52 is far from the channel surface. The NMOS 52 can therefore sustain higher ESD levels than those of the gate-driven technique.

Please refer to FIG. 5. FIG. 5 illustrates experimental results of the dependence between the substrate-biasing voltage and the HBM ESD protection level of the ESD protection NMOS 52 device for a 3.35 $\mu$m silicide CMOS process. As shown in FIG. 5, the HBM ESD level of the substrate-triggered NMOS 52 always increases when the substrate-biasing voltage increases. This result is significantly different from that of the gate-driven design. The substrate-triggered effect turns on a parasitic lateral n-p-n BJT 64 of the NMOS 52 structure to pull the current to flow through the bulk of the NMOS 52, which is far from the surface channel of the NMOS, and so avoids the drain LDD edge structure. The bulk of the NMOS 52 has a larger volume to dissipate ESD-generated heat. The substrate-triggered NMOS 52 can thus sustain a much higher ESD level within the same silicon area. The substrate-triggered technique has consequently become more important in sub-quarter-micron CMOS processes for effective on-chip substrate-triggered ESD protection.

Please refer to FIG. 6. FIG. 6 is a cross-sectional schematic diagram of an ESD protection NMOS device 70 according to the substrate-triggered design. The ESD protection NMOS device 70 comprises a P substrate 71, a P-well 72 in the P substrate 71, and two NMOS devices 73 in the P-well 72. Each NMOS 73 further comprises a source 75, a drain 76, and a doped polysilicon gate 74. A lightly doped drain (LDD) 79 is adjacent to each source 75 and each drain 76. Two shallow trench isolation (STI) structures 77, 78 are used to isolate each NMOS 73 from other electrical devices. One P+ diffusion region 81 next to the STI 77 is electrically connected to the $V_{SS}$ power terminal, and another P+ diffusion region 80 next to the STI 78 is electrically connected to a substrate-biasing circuit 82. One parasitic lateral n-p-n BJT 84 underneath the NMOS 73 is triggered on by the trigger current ($I_{trig}$) conducting from the P+ diffusion region 80 next to the STI 78 when biased by the substrate-biasing circuit 82.

In a typical 0.18 $\mu$m CMOS process, the STI structures 77, 78 have a depth of 0.4~0.5 $\mu$m (from the silicon surface), but the source 75, drain 76 diffusion regions have a junction depth of only 0.15 $\mu$m. The STI 77, 78 regions with a deeper depth provide better isolation between two adjacent diffusion regions. However, such a deep STI 78 region also degrades the substrate-triggered effect of the ESD protection NMOS 73 device, as the trigger current conducting from the P+ diffusion 80 finds it hard to bias the base of the parasitic lateral n-p-n BJT 84. This results in a slow turning-on of the parasitic lateral n-p-n BJT 84 in the NMOS 73. With a slow turn-on speed of the BJT 84, the NMOS 73 serving as the ESD protection device has a decreased ability to protect the internal circuit (not shown).

It is thus important to develop an ESD protection NMOS to avoid the above-mentioned issues of current flowing through the surface channel, and to avoid the STI slowing down the parasitic lateral n-p-n BJT action of the NMOS device.

SUMMARY OF INVENTION

It is a primary objective of the present invention to provide an ESD protection device with a high substrate-triggered effect and related circuit so as to increase the turn-on speed of the ESD protection circuit and resolve heat dissipation problems.

In the preferred embodiment of the present invention, the ESD protection device is formed on a P-type well. The ESD protection device comprises a first NMOS and a second NMOS. Three P+ diffusion regions are in the P-type well. The first and the third P+ diffusion regions are used for electrically connecting to a $V_{SS}$ power terminal. The second P+ diffusion region is between the first and the second NMOS to electrically connected to a P-well biasing circuit and therefore to induce a substrate-trigger current ($I_{trig}$). A first dummy gate is between the first NMOS and the second P+ diffusion region, a second dummy gate is between the second P+ diffusion region and the second NMOS. A first shallow trench isolation (STI) structure is used to isolate the first NMOS and the first P+ diffusion region, and at least one second STI structure is used to isolate the second NMOS and the third P+ diffusion region. The drain of each NMOS, the source of each NMOS, and the P-type well form a parasitic lateral n-p-n bipolar junction transistor (BJT), respectively. The substrate trigger current ($I_{trig}$) flows into the P-type well underneath each dummy gate to turn on each adjacent parasitic lateral n-p-n BJT so the ESD protection device quickly discharges an ESD current to the $V_{SS}$ power terminal.

It is an advantage of the present invention that an additional dummy gate is used to block the shallow trench isolation between the MOS drain diffusion region and the diffusion region connected to the substrate-biasing circuit. Discharging of the ESD current is thus performed more quickly by utilizing the substrate-trigger current $I_{trig}$ generated from the substrate-biasing circuit. Heat dissipation problems resulting from the ESD current flowing through the surface channel are thus solved. By applying the MOS device structure in the ESD protection circuit according to the present invention, not only is the ESD robustness effectively increased with an overall increase of ESD protection, but also the MOS device structure is fully compatible with standard CMOS processes.

BRIEF DESCRIPTION OF DRAWINGS

FIG. 5 is illustrates experimental results of the dependence between a substrate-biasing voltage and the HBM ESD protection level of a ESD protection NMOS device in a 0.35 $\mu$m silicide CMOS process.

DETAILED DESCRIPTION

Figure 1:
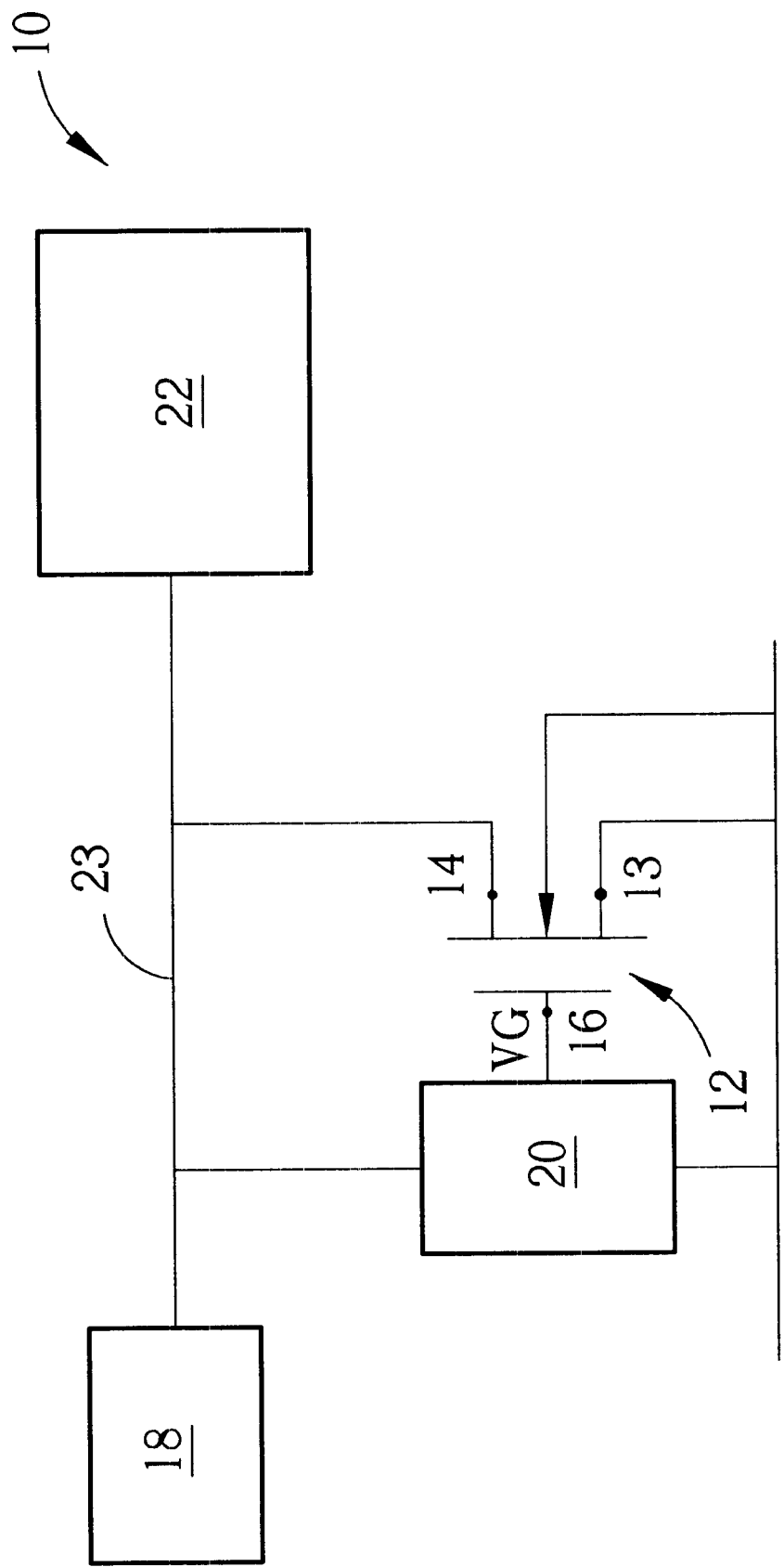
FIG. 1 is a schematic circuit diagram of a typical ESD protection design using a gate-driven technique.
Figure 2:
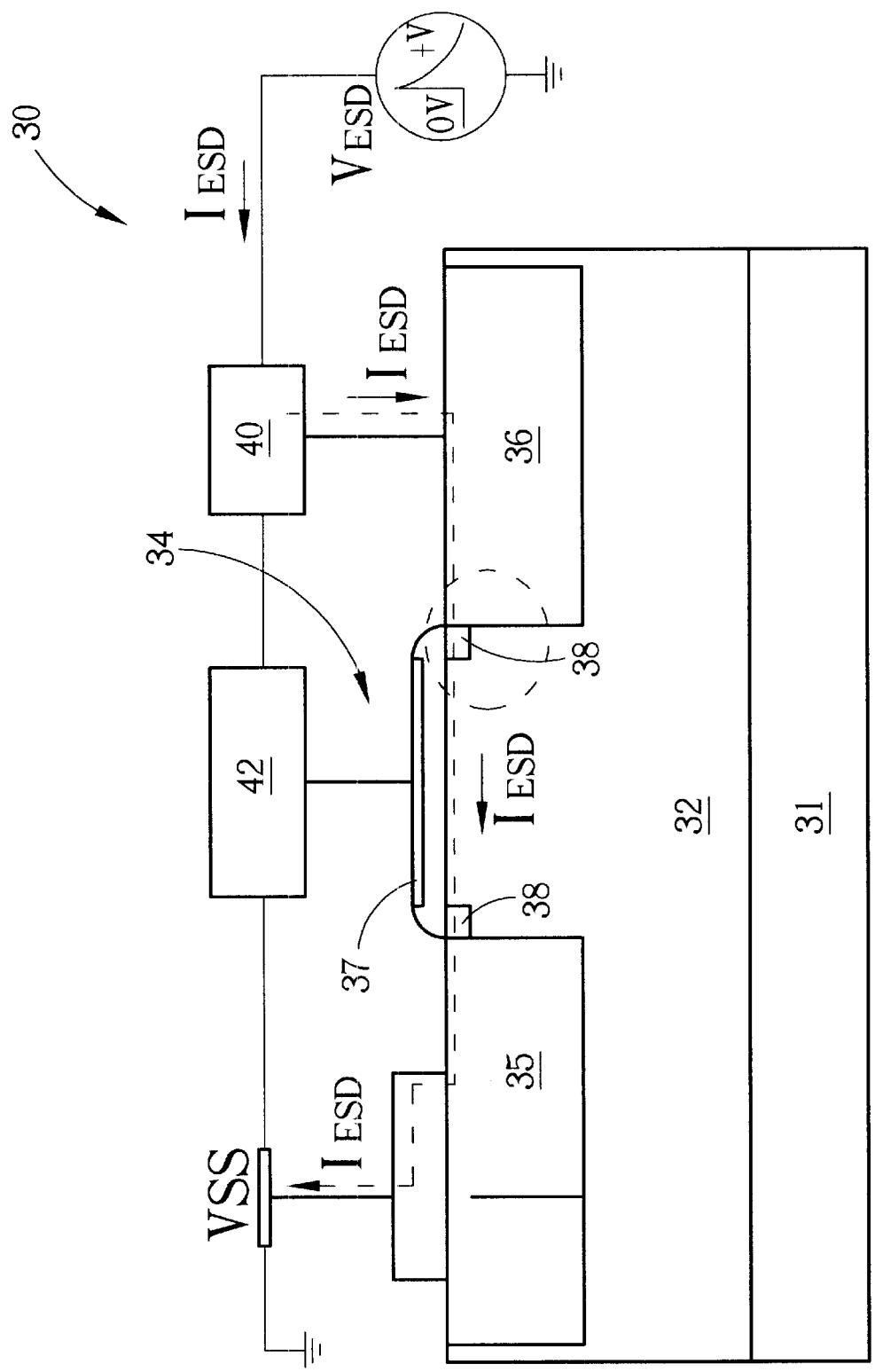
FIG. 2 is a schematic diagram of an ESD current path flowing through a gate-driven NMOS device.
Figure 3:
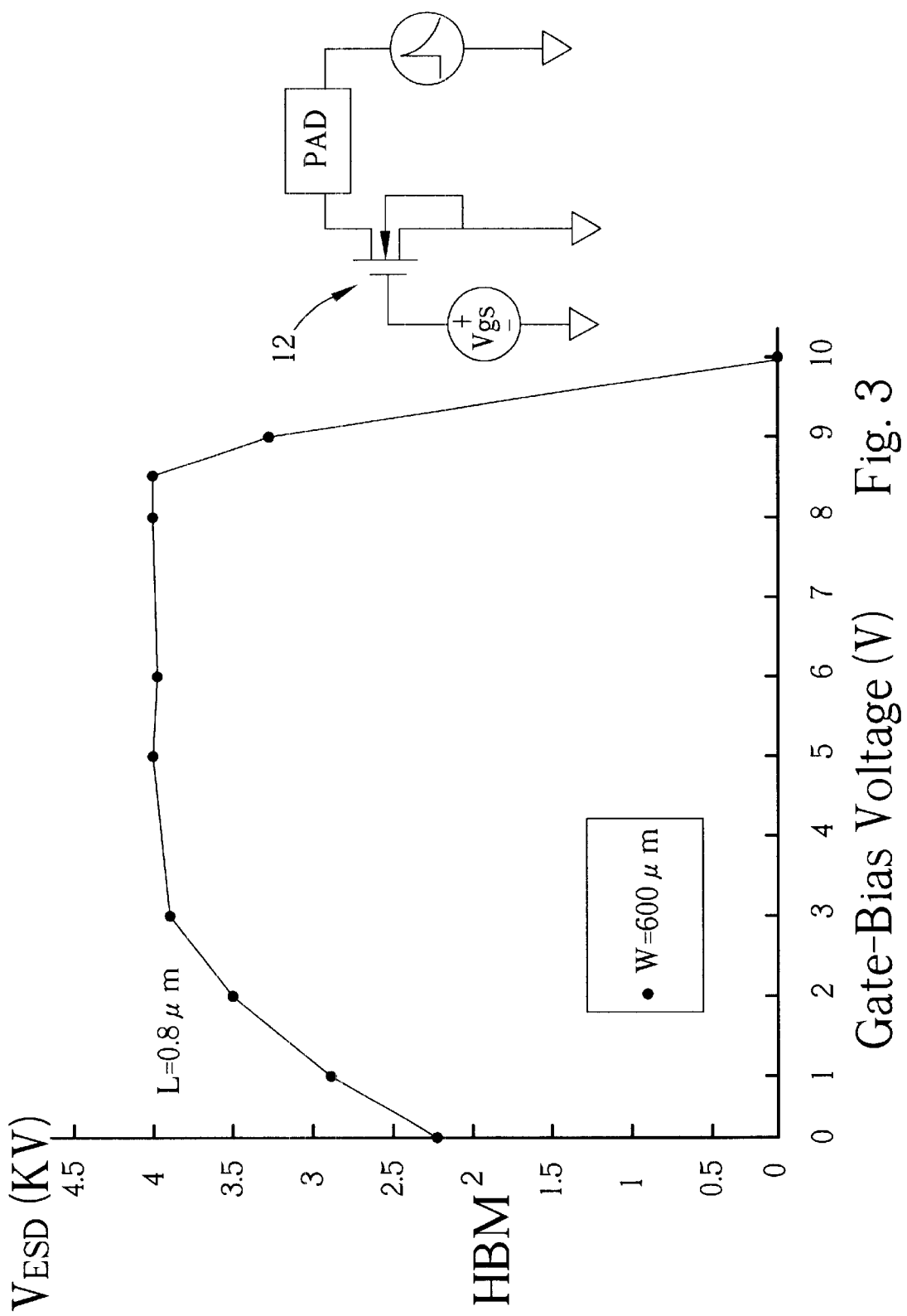
FIG. 3 is illustrates experimental results of the dependence between a gate-biasing voltage and the HBM ESD protection level of an NMOS device in a 0.35 $\mu$m silicide CMOS process.
Figure 4:
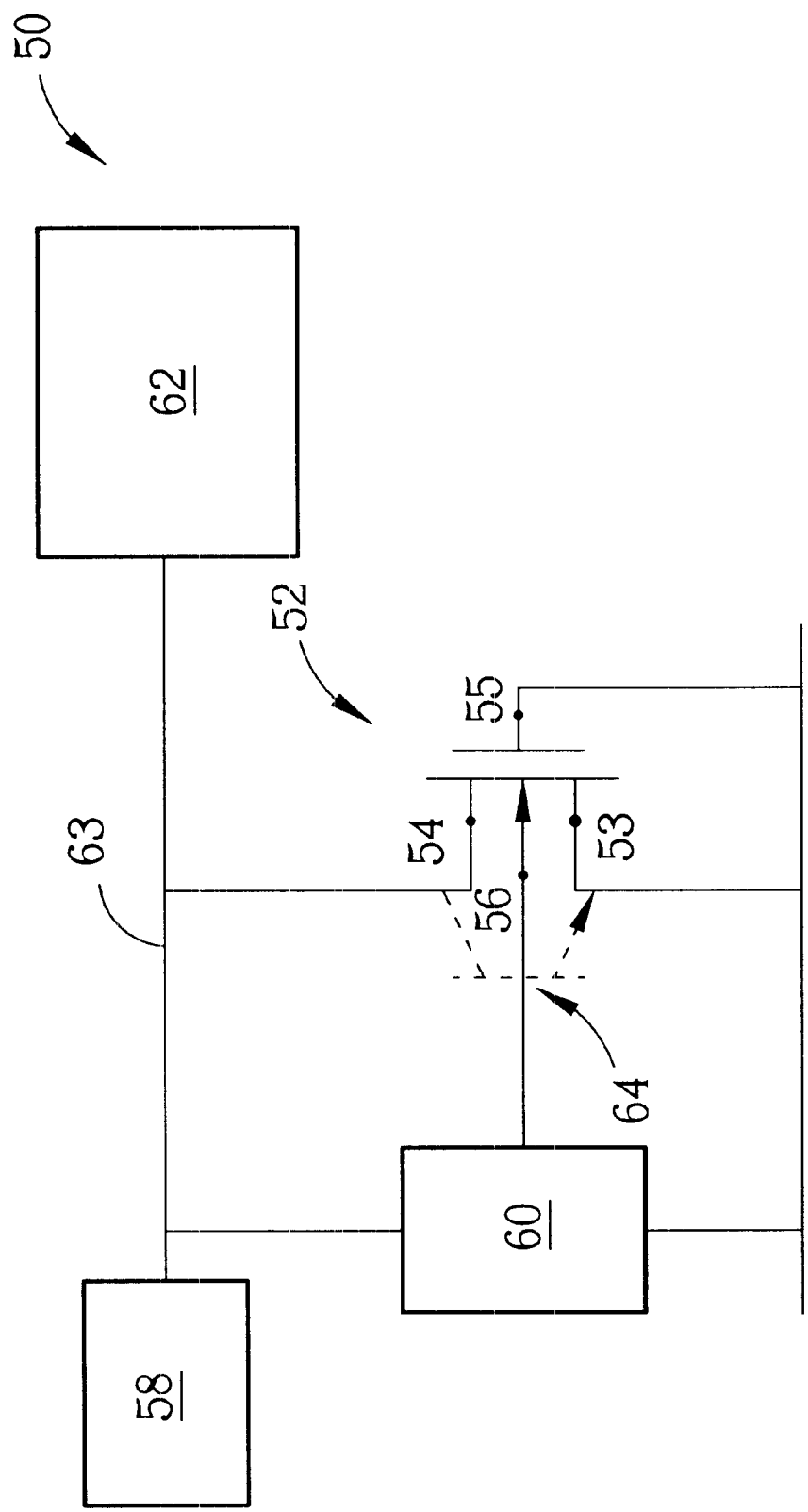
FIG. 4 is a schematic circuit diagram of another prior art ESD protection design using a substrate-triggered technique.
Figure 6:
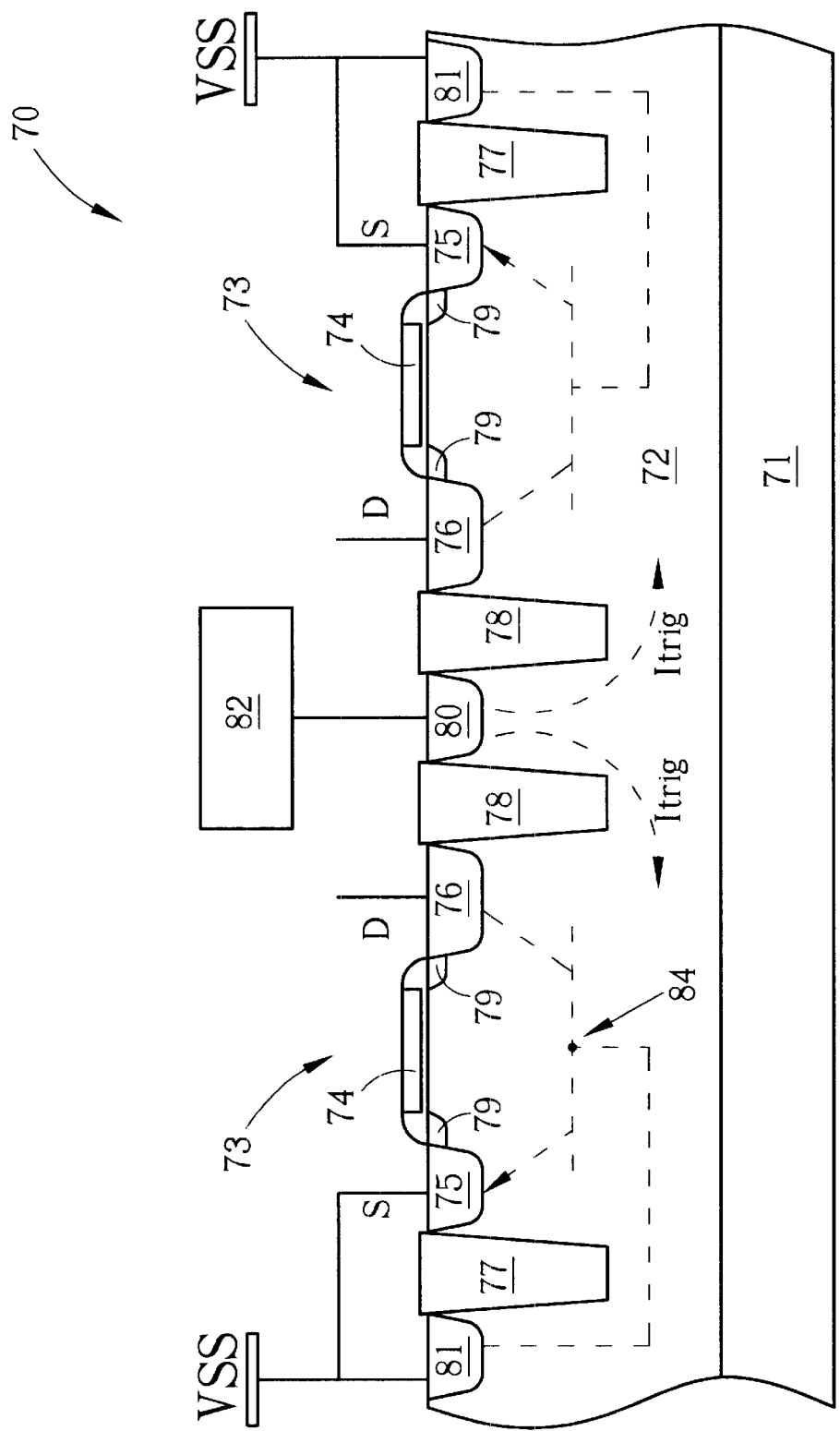
FIG. 6 is a cross-sectional schematic diagram of an ESD protection NMOS device according to a substrate-triggered design.
Figure 7:
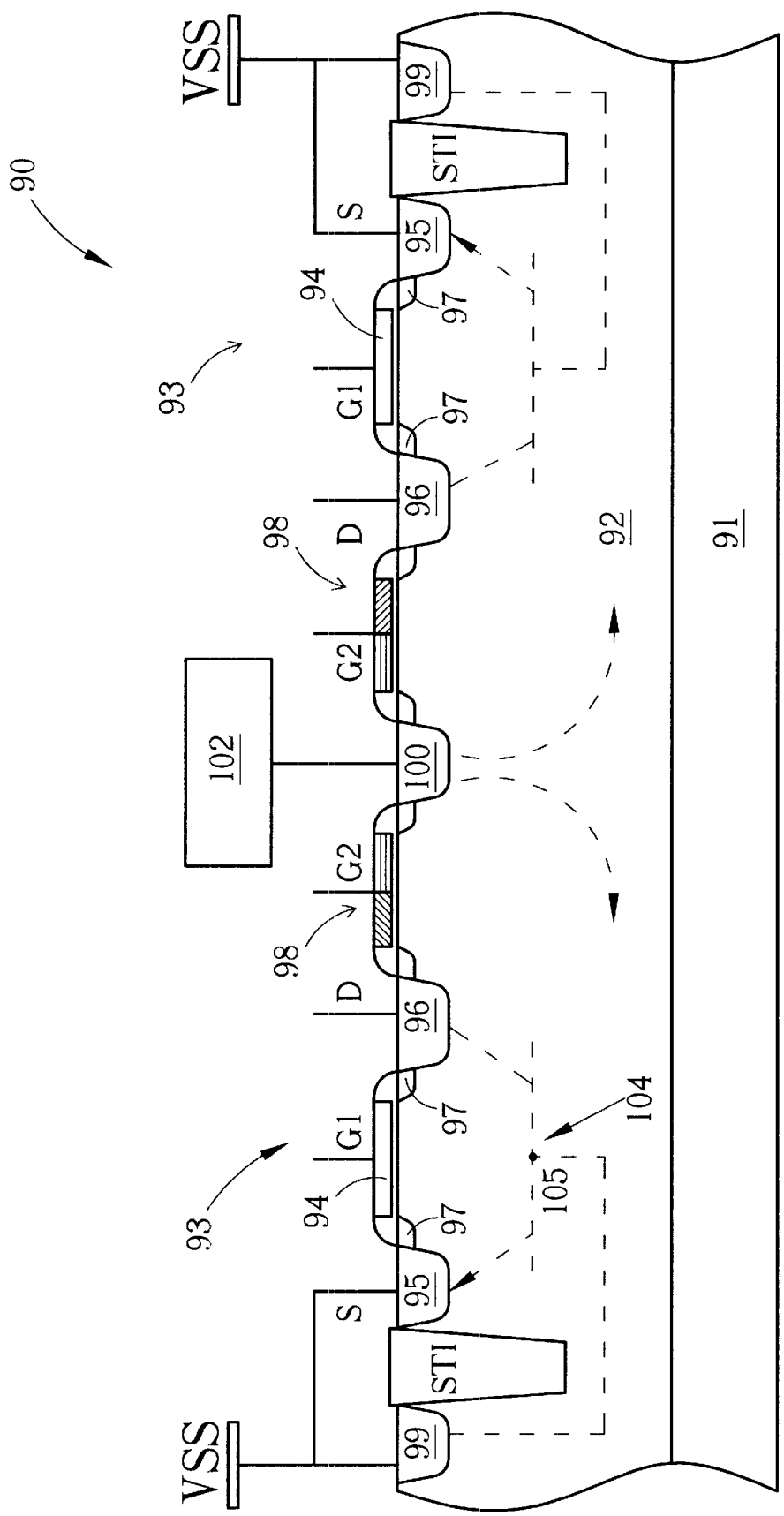
FIG. 7 is a cross-sectional schematic diagram of an ESD protection NMOS device with a high substrate-triggered effect according to the present invention.

Please refer to FIG. 7. FIG. 7 is a cross-sectional schematic diagram of an ESD protection device 90 with a high substrate-triggered effect according to the present invention. As shown in FIG. 7, the ESD protection device 90 is formed on a P-type well 92 in a P-type substrate 91. The ESD protection device 90 comprises two NMOS devices 93 in the P-type well 92, two P$^+$ diffusion regions 99 electrically connected to a V$_{SS}$ power terminal, a P$^+$ diffusion region 100 electrically connected to a substrate-biasing circuit 102, two dummy gates (G2) 98 between each NMOS 93 and each P$^+$ diffusion region 100, and two shallow trench isolation (STI) structures between each NMOS 93 and each P$^+$ diffusion region 99. Each NMOS 93 comprises a source 95 electrically connected to the V$_{SS}$ power terminal, a drain 96 electrically connected to an I/O pad (not shown), a doped polysilicon gate 94, and two lightly doped drains (LDD) 97.

The drain 96 and the source 95 of each NMOS 93 and the P-type well 92 form a parasitic lateral n-p-n BJT 104, which can be quickly triggered on by the substrate-biasing circuit 102 to improve the substrate-triggered effect of the ESD protection device 90. Therefore, when the parasitic lateral n-p-n BJT 104 is triggered on by the substrate-biasing circuit 102, that is, when the parasitic lateral n-p-n BJT 104 is triggered on by current conducting from the P$^+$ diffusion region 100, an ESD current conducted from the I/O pad is quickly discharged to the V$_{SS}$ power terminal through the ESD protection device 90. It worth noting that each NMOS 93 in the ESD protection device 90 of the present invention is a standard NMOS structure. However, each NMOS 93, combined with the dummy gate 98, can be regarded as an NMOS device structure with a high substrate-triggered effect.

Without an STI region between the NMOS 93 and the P$^+$ diffusion region 100, the substrate-triggered current generated from the substrate-biasing circuit 102 more easily reaches the base 105 of the parasitic lateral n-p-n BJT 104 of the NMOS device structure. Therefore, the parasitic lateral n-p-n BJT 104 action in this new proposed NMOS device 93 structure is triggered on more quickly to discharge fast transient ESD currents. By using this new proposed NMOS device 93 structure, the turn-on speed of the ESD protection NMOS device 93 in the sub-quarter-micron CMOS process is not degraded by an STI region (not shown). The substrate-triggered effect triggers the parasitic lateral n-p-n BJT 104 of the NMOS device 93 on to pull current to flow through the substrate of the NMOS 93, which is far from the surface channel of the NMOS device 93. The bulk of the NMOS 93 has a larger volume to dissipate heat generated by the ESD current, and therefore the substrate-triggered NMOS device 93 of the present invention can sustain a much higher ESD protection level within the same silicon area when compared to the gate-driven NMOS device in the ESD protection circuit design 10 of the prior art. When compared to the prior art substrate-triggered NMOS device 73 having an STI structure, the substrate-triggered NMOS device 93 of the present invention has a faster turn-on speed to cause the BJT action to discharge ESD current.

Figure 8:
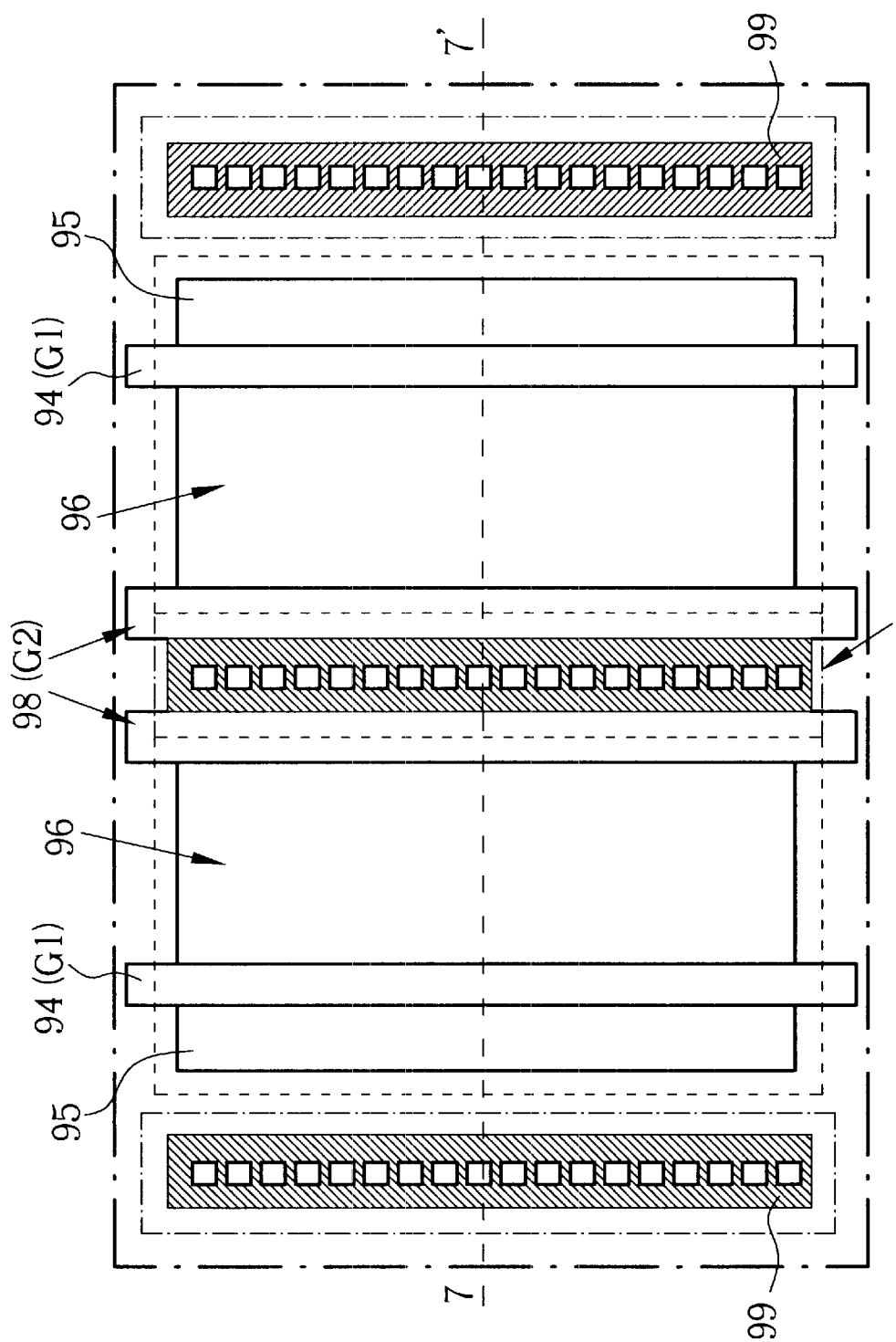
FIG. 8 is a schematic diagram of the corresponding layout for an NMOS device according to the present invention.

The new proposed dummy gate 98 and NMOS device 93 structure having a high substrate-triggered effect can be easily realized by simply a suitable layout design in the mask layers. Please refer to FIG. 8. FIG. 8 is a schematic diagram of the corresponding layout for the NMOS device 93 according to the present invention. A cross-sectional view along dashed line 7–7" is depicted in FIG. 7. As shown in FIG. 8, the dummy gate G2 98 uses a polysilicon material as a gate, but the doping type of the left-half part (the side closest to the N$^+$ drain 96 diffusion region) of the dummy gate 98 is different from the right-half part (the side closest to the P$^+$ diffusion 100).

Since the dummy gate 98 is added to prevent the formation of an STI region between the P$^+$ diffusion 100 connected to the P-well biasing circuit and the N$^+$ drain 96 diffusion, the dummy gate 98 has no function for the NMOS device 93. The doping concentration and doping type of the dummy gate 98 thus has no effect at all on the NMOS device 93. For process compatibility of typical sub-quarter-micron CMOS processes, the dummy gate 98 is designed as shown in FIG. 7 and FIG. 8. Furthermore, the channel length of the dummy gate 98 does not need to be equal to the channel length of each NMOS 93.

For process convenience and alignment tolerance, as the NMOS transistor 93 has the N$^+$ diffusion in the drain 96 and source 95 regions, the partial gate region of the dummy gate 98 (that is closest to the N$^+$ drain 96 diffusion) is doped by the same implantation process that is used for the implantation of the NMOS source/drain N-type dopants. At the other partial gate region of the dummy gate 98 (which is closest to the P$^+$ diffusion 100 for substrate triggering), the partial gate material is doped by the same implantation process as is used for the PMOS (not shown) drain/source implantation of P-type dopants. The dummy gate 98 thus has the N+ and P+ dopants for gate polysilicon material of the dummy gate 98. With a suitable placement on the layout pattern, the new proposed NMOS device 93 structure for a substrate-triggered design according to the present invention can be realized in typical CMOS processes. The invention thus has wide applicability for CMOS IC products.

Figure 9:
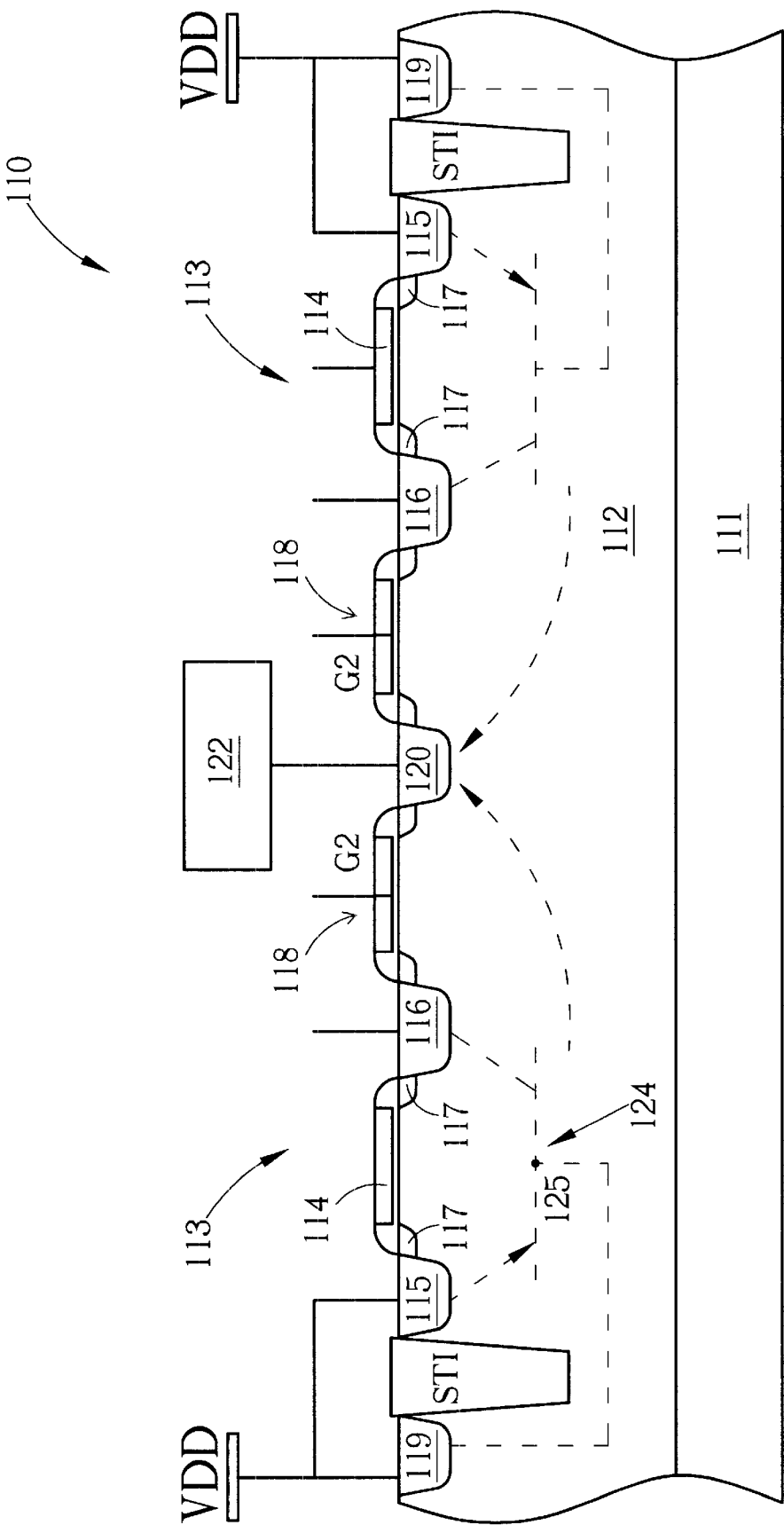
FIG. 9 is across-sectional schematic diagram of an ESD protection PMOS device with a high substrate-triggered effect according to the present invention.

The concept of the present invention may also be applied to increase the turn-on speed of an ESD protection PMOS device in sub-quarter-micron CMOS processes that utilize shallow trench isolation. Please refer to FIG. 9. FIG. 9 is across-sectional schematic diagram of an ESD protection device 110 with a high substrate-triggered effect according to the present invention. As shown in FIG. 9, the ESD protection device 110 is formed on an N-type well 112 in a P-type substrate 111. The ESD protection device 110 comprises two PMOS devices 113 in the N-type well 112, two N$^+$ diffusion regions 119 for electrically connecting to a V$_{DD}$ power terminal, an N+ diffusion region 120 for electrically connecting to a substrate-biasing circuit 122, two dummy gates (G2) 118 between each PMOS device 113 and the N+ diffusion region 120, and two shallow trench isolation (STI) structures between each PMOS device 113 and each N+ diffusion region 119. Each PMOS device 113 further comprises a source 115 for electrically connecting to a $V_{DD}$ power terminal, a drain 116 for electrically connecting to an I/O buffering pad (not shown), a doped polysilicon gate 114, and two lightly doped drains (LDD) 117.

The drain 116 and the source 115 of each PMOS 113 and the N-type well 12 form a parasitic lateral p-n-p BJT 124, which is quickly triggered on by the substrate-biasing circuit 122 to improve the substrate-triggered effect of the ESD protection device 110. Therefore, when the parasitic lateral p-n-p BJT 124 is triggered on by the substrate-biasing circuit 122, that is, when the parasitic lateral p-n-p BJT 124 is triggered on by current conducting from the diffusion region 120, ESD current conducted from the I/O buffering pad (not shown) to the ESD protection device 110 is discharged to the $V_{DD}$ power terminal.

The dummy gate G2 118 in FIG. 9 has both P-type and N-type dopants. The partial polysilicon material of the dummy gate 118, which is closest to the PMOS drain 116 diffusion region, uses the same implantation process as the PMOS drain/source implantation process. The partial polysilicon material of the dummy gate 118, which is closest to the center N+ diffusion region 120 connected to the N-well biasing circuit 122, uses the same implantation process as the NMOS (not shown) drain/source implantation process. Such a device is easily realized by typical CMOS processes with a suitable arrangement of the layout pattern. Since the dummy gate 118 is used to avoid the formation of an STI region (not shown) between the N+ diffusion 120 connected to the N-well biasing circuit 122 and the PMOS drain 116 diffusion region, the dummy gate 118 has no functional affect on the PMOS device 113.

Compared to prior art substrate-triggered ESD protection devices, the ESD protection device 110 of the present invention has a faster turn-on speed to initiate action of the BJT 124 to discharge ESD current. The ESD current flows through the substrate of PMOS device 113, which is far from the channel surface of the PMOS device 113, and so more heat generated by the ESD current can be dissipated.

Figure 10:
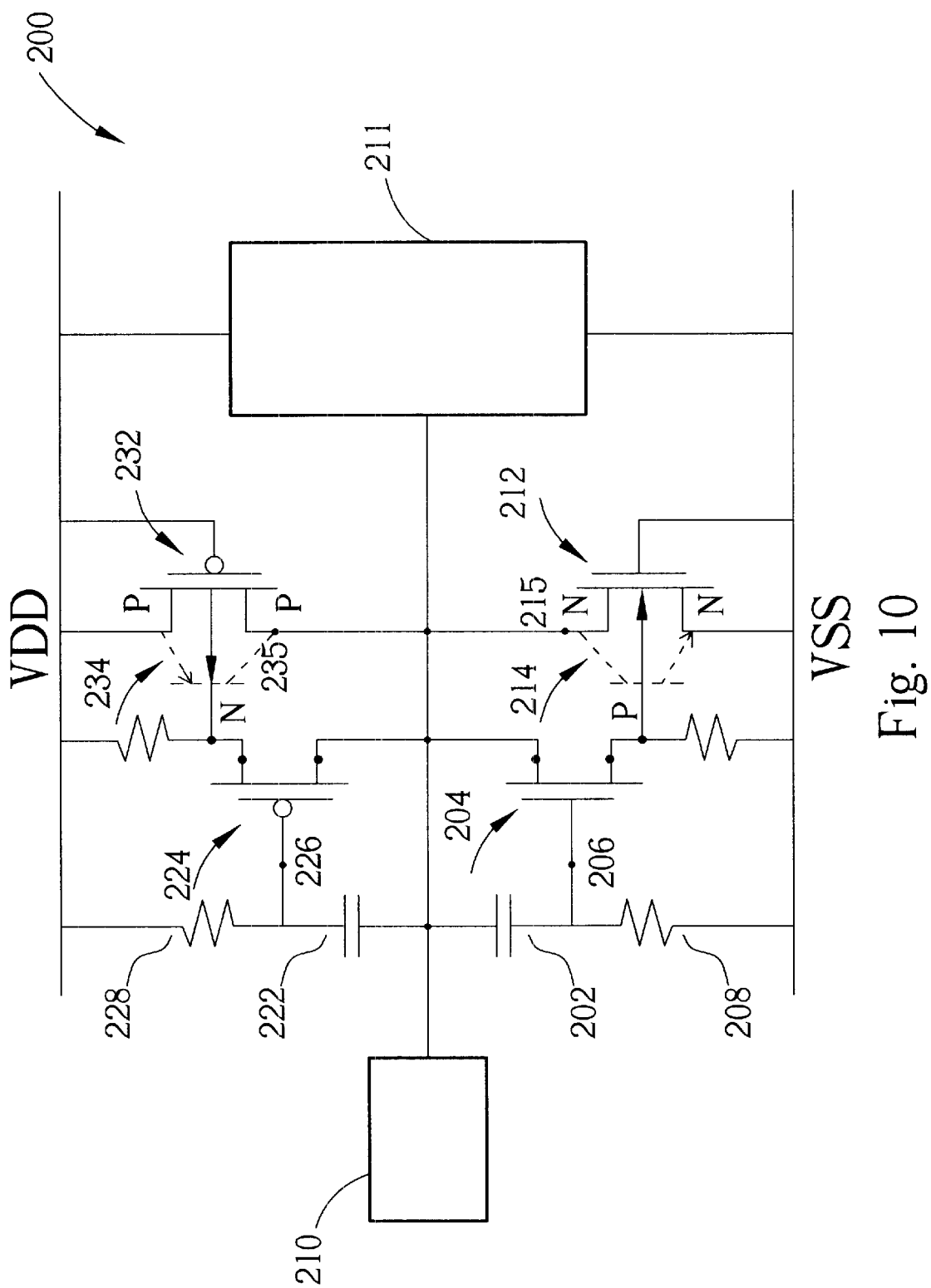
FIG. 10 is a schematic circuit diagram of an input ESD protection circuit according to the present invention.

Please refer to FIG. 10. FIG. 10 is a schematic circuit diagram of an input ESD protection circuit 200 according to the present invention. As shown in FIG. 10, the input ESD protection circuit 200 is realized by the substrate-triggered technique utilizing an NMOS and PMOS device structure according to the present invention. When a positive-to-$V_{SS}$ ESD zapping event occurs on an input pad 210, the $V_{SS}$ power terminal is grounded and the $V_{DD}$ power terminal is floated. The sharply-rising ESD voltage pulse is coupled through a capacitor Cn 202 to a gate 206 of an NMOS Mn1 204. This coupled voltage is maintained on the gate 206 of the NMOS Mn1 204 for a longer period of time by a resistor Rn 208.

Under a coupled voltage that is greater than the threshold voltage ($V_{th}$) of the NMOS Mn1 204, the NMOS Mn1 204 is turned on and conducts some ESD current from the pad 210 through the center P+ diffusion 100 (in FIG. 7) into the P-type well 92 region (in FIG. 7, or P-type substrate 91) of the ESD protection NMOS Mn2 212. With a trigger current generated from the transistor Mn1 204, the ESD protection NMOS Mn2 212 is turned on more quickly to discharge the ESD current from the pad 210 to the $V_{SS}$ power terminal, and so the ESD current will not flow into an internal circuit 211. The substrate-triggered current generated from the NMOS Mn1 204 triggers on a parasitic lateral n-p-n BJT 214 of the ESD protection NMOS Mn2 212 to pull current to flow through the substrate (bulk) of the ESD protection NMOS Mn2 212, which is far from the surface channel of the ESD protection NMOS Mn2 212. The bulk of the ESD protection NMOS Mn2 212 has a larger volume to dissipate ESD-generated heat, and therefore the substrate-triggered ESD protection NMOS Mn2 212 can sustain a much higher ESD level.

When a negative-to-$V_{SS}$ ESD zapping event occurs on the input pad 210, the $V_{SS}$ power terminal is grounded and the $V_{DD}$ power terminal is floated. The p-n junction between the drain 215 region of the ESD protection NMOS Mn2 212 and the P-type well (P substrate) is forward biased to discharge the ESD current to the $V_{SS}$ power terminal. The forward-biased junction has a much lower operating voltage (~0.8–1.0V), and can therefore sustain a much higher ESD level in the ESD protection NMOS Mn2 212 device under such ESD stress condition.

When a positive-to-$V_{DD}$ ESD zapping event occurs on the input pad 210, the $V_{DD}$ power terminal is grounded and the $V_{SS}$ power terminal is floated. The p-n junction between the drain 235 region of the ESD protection PMOS Mp2 232 and the N-type well is forward biased to discharge the ESD current to the $V_{DD}$ power terminal. The forward-biased junction has a much lower operating voltage (~0.8–1.0V), and can therefore sustain a much higher ESD level in the ESD protection PMOS Mp2 232 device under such ESD stress condition.

With a negative-to-$V_{DD}$ ESD zapping on the input pad 210, the $V_{DD}$ power terminal is grounded and the $V_{SS}$ power terminal is floated. The sharply-falling negative ESD voltage pulse is coupled through the capacitor Cp 222 to the gate 226 of the PMOS Mp1 224. This coupled voltage is maintained on the gate 226 of the PMOS Mp1 224 for a longer period of time by resistor Rp 228. With a coupled negative gate voltage, the PMOS Mp1 224 is turned on and conducts some negative ESD current from the pad 210 through the N+ diffusion region 120 (in FIG. 9) into the N-type well 112 region (in FIG. 9) of the ESD protection PMOS Mp2 232. With a trigger current generated from the PMOS Mp1 224, the ESD protection PMOS Mp2 232 is turned on more quickly to discharge the negative ESD current from the pad 210 to the $V_{DD}$ power terminal. The substrate-triggered current generated from the PMOS Mp1 224 triggers on the parasitic lateral p-n-p BJT 234 of the ESD protection PMOS Mp2 232 to pull the current to flow through the N-type well (bulk) of the ESD protection PMOS Mp2 232, which is far from the surface channel of the ESD protection PMOS Mp2 232. The bulk of the ESD protection PMOS Mp2 232 has a larger volume to dissipate ESD-generated heat, and therefore the substrate-triggered ESD protection PMOS Mp2 232 can sustain a much higher ESD protection level.

Figure 11:
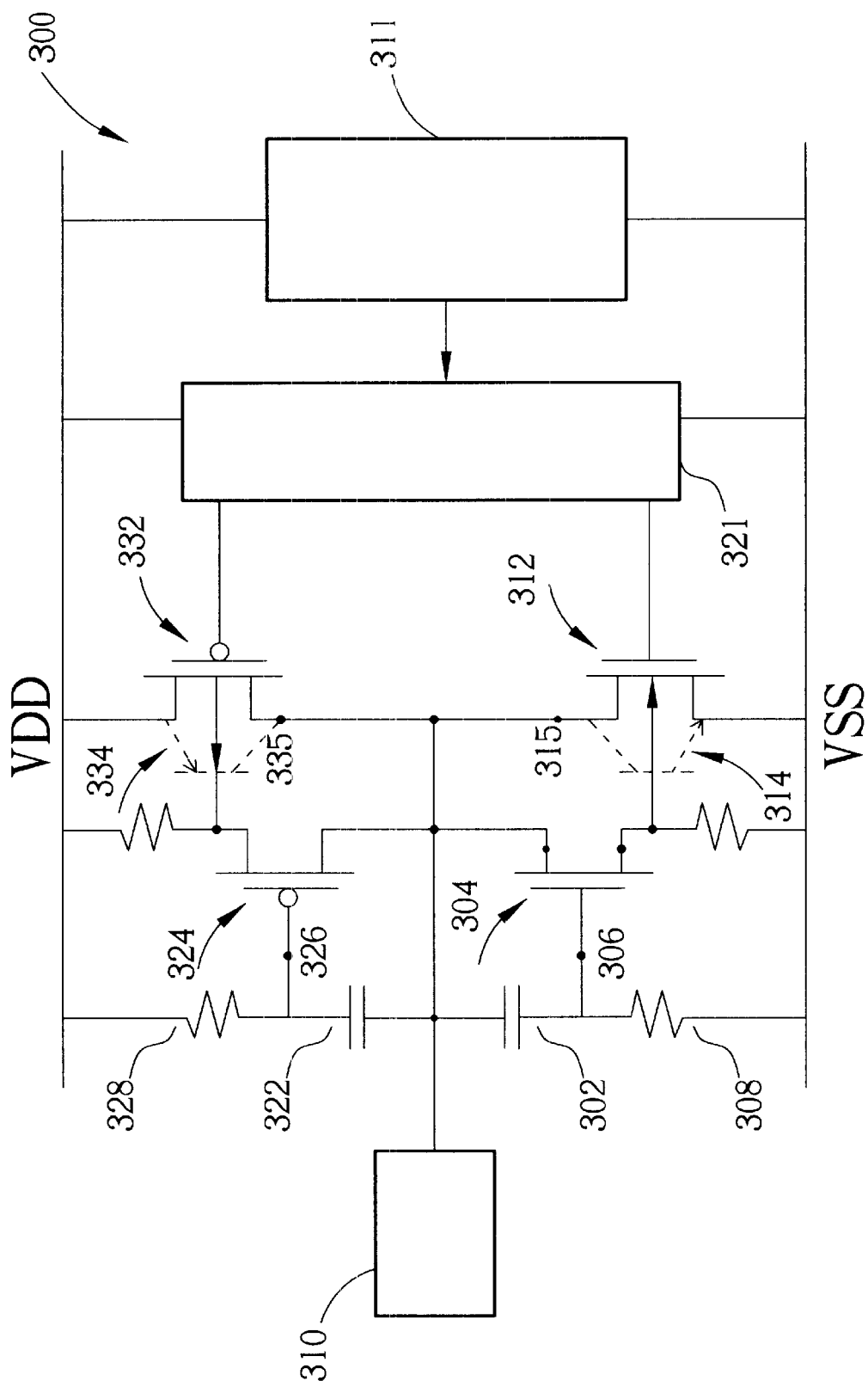
FIG. 11 is a schematic circuit diagram of an output ESD protection circuit according to the present invention.

The same inventive concept may be applied to output ESD protection circuit designs as the second embodiment of the present invention. Please refer to FIG. 11. FIG. 11 is a schematic circuit diagram of an output ESD protection circuit 300 according to the present invention. As shown in FIG. 11, the output ESD protection circuit 300 is realized by the substrate-triggered technique with the PMOS and NMOS device structure according to the present invention. The circuit design of the ESD protection circuit 300 is similar to that of the input ESD protection circuit 200. The ESD protection circuit 300 further comprises a pre-driver circuit 321 between an internal circuit 311 and the ESD protection circuit 300. As shown in FIG. 11, when a positive-to-$V_{SS}$ ESD zapping event occurs on the output pad 310, the $V_{SS}$ power terminal is grounded and the $V_{DD}$ power terminal is floated. The sharply-rising ESD voltage pulse is coupled through a capacitor 302 to a gate 306 of NMOS Mn1 304. This coupled voltage is maintained on the gate 306 of the NMOS Mn1 304 for a longer period of time by a resistor 308.

With a coupled voltage greater than the threshold voltage ($V_{th}$) of the NMOS Mn1 304, the NMOS Mn1 304 is turned on and conducts some of the ESD current from the pad 310 through the P$^+$ diffusion region 100 (in FIG. 7) into the P-type well 92 region (in FIG. 7, or P-type substrate 91) of the ESD protection NMOS 312. With a trigger current generated from the NMOS Mn1 304, the ESD protection NMOS 312 is turned on more quickly to discharge the ESD current from the pad 310 to the $V_{SS}$ power terminal. The substrate-triggered current generated from the NMOS Mn1 304 triggers on the parasitic lateral n-p-n BJT 314 of the ESD protection NMOS 312 to pull the current to flow through the substrate (bulk) of the ESD protection NMOS 312, which is far from the surface channel of the ESD protection NMOS 312. The bulk of the ESD protection NMOS 312 has a larger volume to dissipate ESD-generated heat, and therefore the substrate-triggered ESD protection NMOS 312 can sustain a much higher ESD protection level.

With a negative-to-$V_{SS}$ ESD zapping on the output pad 310, the $V_{SS}$ power terminal is grounded and the $V_{DD}$ power terminal is floated. The p-n junction between the drain 315 region of the ESD protection NMOS 312 and the P-type well (P-type substrate) is forward biased to discharge the ESD current to the $V_{SS}$ power terminal. The forward-biased junction has a much lower operating voltage (~0.8–1.0V), and can therefore sustain a much higher ESD protection level in the ESD protection NMOS 312 device under such ESD stress condition.

With a positive-to-$V_{DD}$ ESD zapping on the output pad 310, the $V_{DD}$ power terminal is grounded and the $V_{SS}$ power terminal is floated. The p-n junction between the drain 335 region of the ESD protection PMOS 332 and the N-type well is forward biased to discharge the ESD current to the $V_{DD}$ power terminal. The forward-biased junction has a much lower operating voltage (~0.8–1.0V), and can therefore sustain a much higher ESD protection level in the ESD protection PMOS 332 device under such ESD stress condition.

With a negative-to-$V_{DD}$ ESD zapping on the output pad 310, the $V_{DD}$ power terminal is grounded and the $V_{SS}$ power terminal is floated. The sharply-falling negative ESD voltage pulse is coupled through the capacitor 322 to the gate 326 of the PMOS Mp1 324. This coupled voltage is maintained on the gate 326 of the PMOS Mp1 324 for a longer period of time by resistor 328. With a coupled negative gate voltage, the PMOS Mp1 324 is turned on and conducts some negative ESD current from the pad 310 through the center N$^+$ diffusion region 120 (in FIG. 9) into the N-type well 112 region (in FIG. 9) of the ESD protection PMOS 332. With a trigger current generated from the PMOS Mp1 324, the ESD protection PMOS 332 is turned on more quickly to discharge the negative ESD current from the pad 310 to the $V_{DD}$ power terminal. The substrate-triggered current generated from the PMOS Mp1 324 triggers on the parasitic lateral p-n-p BJT 334 of the ESD protection PMOS 332 to pull the current to flow through the N-type well (bulk) of the ESD protection PMOS 332, which is far from the surface channel of the ESD protection PMOS 332. The bulk of the ESD protection PMOS 332 has a larger volume to dissipate ESD-generated heat, and therefore the substrate-triggered ESD protection PMOS 332 can sustain a much higher ESD protection level.

Figure 12:
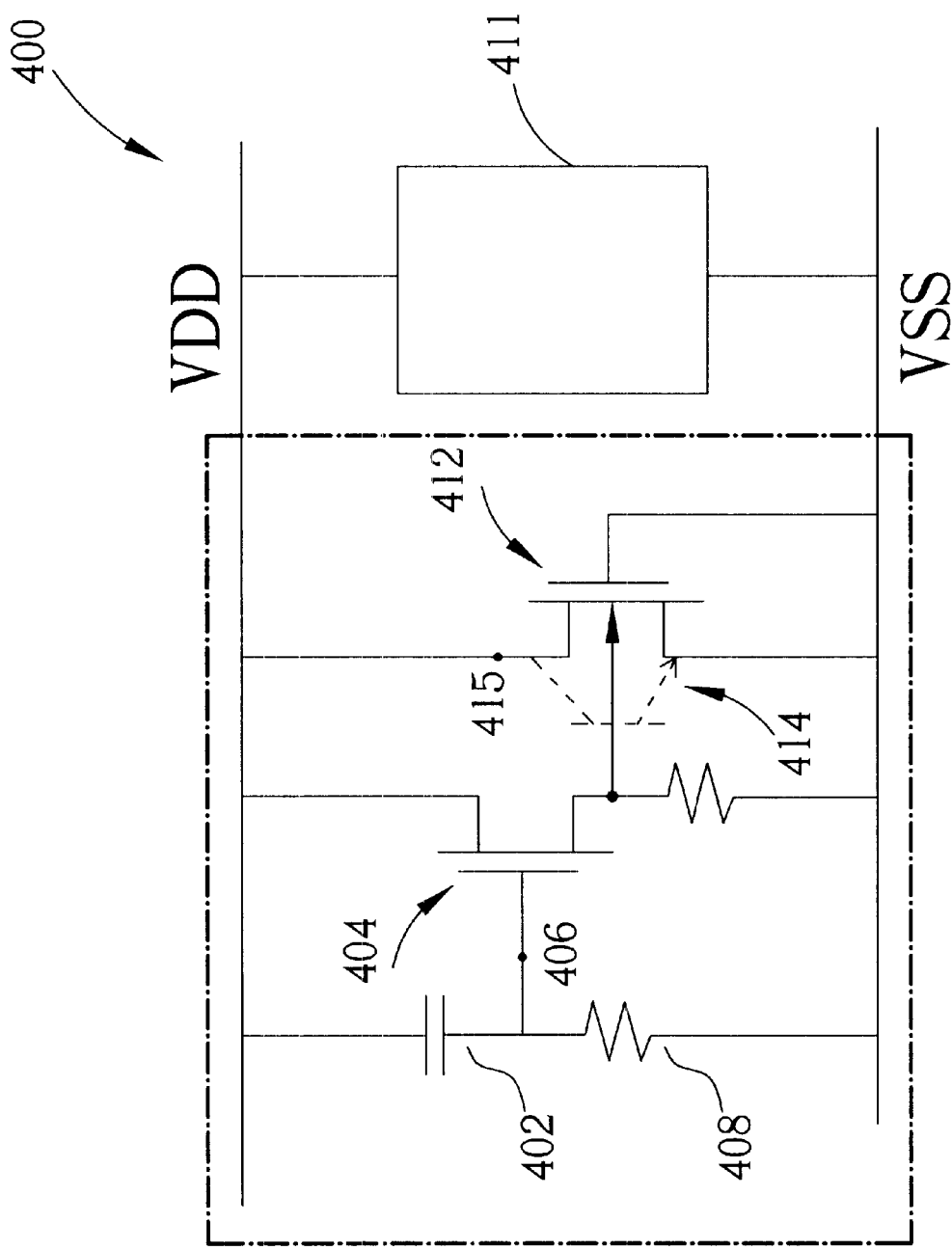
FIG. 12 is a schematic circuit diagram of a power-rail ESD clamp circuit according to the present invention.

The same inventive concept may be applied to power-rail ESD clamp circuit designs as a third embodiment of the present invention, since ESD pulses may occur across the $V_{DD}$ and $V_{SS}$ power pins of an IC product. Please refer to FIG. 12. FIG. 12 is a schematic circuit diagram of a power-rail ESD clamp circuit 400 according to the present invention. As shown in FIG. 12, under a positive ESD pulse across the $V_{DD}$ and $V_{SS}$ power lines, the $V_{SS}$ power terminal is grounded. The sharply-rising ESD voltage pulse is coupled through a capacitor 402 to a gate 406 of NMOS Mn1 404. This coupled voltage is maintained on the gate 406 of the NMOS Mn1 404 for a longer period of time by resistor 408.

With a coupled voltage greater than the threshold voltage ($V_{th}$) of the NMOS Mn1 404, the NMOS Mn1 404 is turned on and conducts some of the ESD current through the P$^+$ diffusion region 100 (in FIG. 7) into the P-type well 92 region (in FIG. 7, or P-type substrate 91) of the ESD protection NMOS 412. With a trigger current generated from the NMOS Mn1 404, the ESD protection NMOS 412 is turned on more quickly to discharge the ESD current from the $V_{DD}$ power terminal to the $V_{SS}$ power terminal, and so the ESD current will not flow into an internal circuit 411. The substrate-triggered current generated from the transistor 404 triggers on a parasitic lateral n-p-n BJT 414 of the ESD protection NMOS 412 to pull the current to flow through the substrate (bulk) of the ESD protection NMOS 412, which is far from the surface channel of the ESD protection NMOS 412. The bulk of the ESD protection NMOS 412 has a larger volume to dissipate ESD-generated heat, and therefore the substrate-triggered ESD protection NMOS 412 can sustain a much higher ESD protection level.

Under a negative ESD pulse across the $V_{DD}$ and $V_{SS}$ power lines, the $V_{SS}$ power terminal is grounded. The p-n junction across the drain 415 diffusion region of the ESD protection NMOS Mn2 412 and the P-type well (P-type substrate) is forward biased to discharge ESD current to the $V_{SS}$ power terminal. The forward-biased junction has a much lower operating voltage (~0.8–1.0V), and can therefore sustain a much higher ESD protection level in the ESD protection NMOS 412 device under such ESD stress condition.

When the IC is operating under the normal circuit conditions with the $V_{DD}$ and $V_{SS}$ power supply lines, the gate 406 of the NMOS Mn1 404 is connected to the $V_{SS}$ power terminal through the resistor Rn1 408, which keeps the NMOS Mn1 404 turned off. Because the NMOS Mn1 404 is off under normal circuit conditions, there is no trigger current into the P-type substrate (P-type well) of the ESD protection NMOS Mn2 412 device. The ESD protection NMOS Mn2 412 is therefore kept off under normal circuit conditions.

Figure 13:
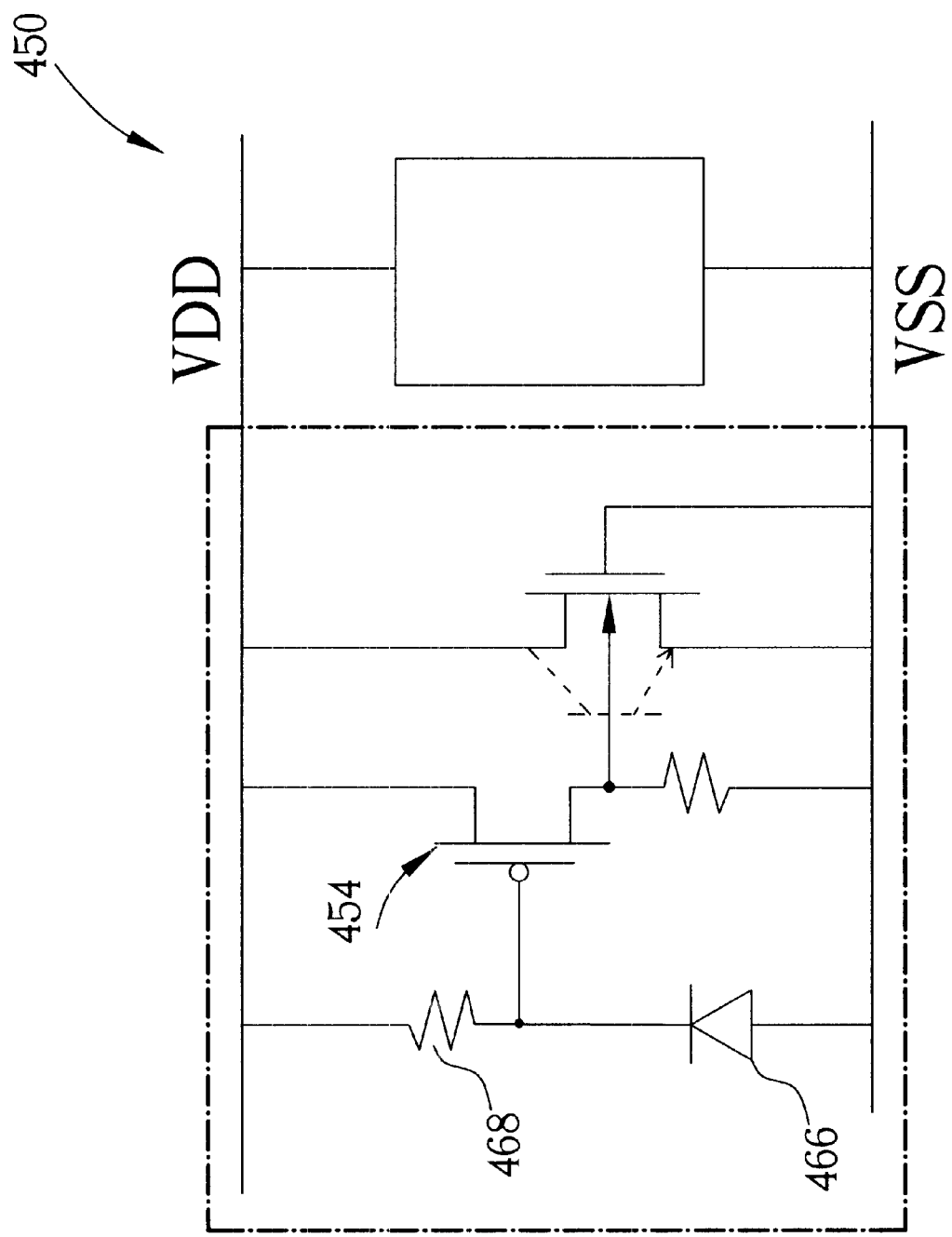
FIG. 13 is a schematic circuit diagram of an alternative design for a power-rail ESD clamp circuit according to the present invention.

Please refer to FIG. 13. FIG. 13 is a schematic circuit diagram of an alternative design for a power-rail ESD clamp circuit 450 according to the present invention. As shown in FIG. 13, a substrate-biasing circuit is realized by a diode 466, a resistor 468, and a PMOS transistor 454.

Figure 14:
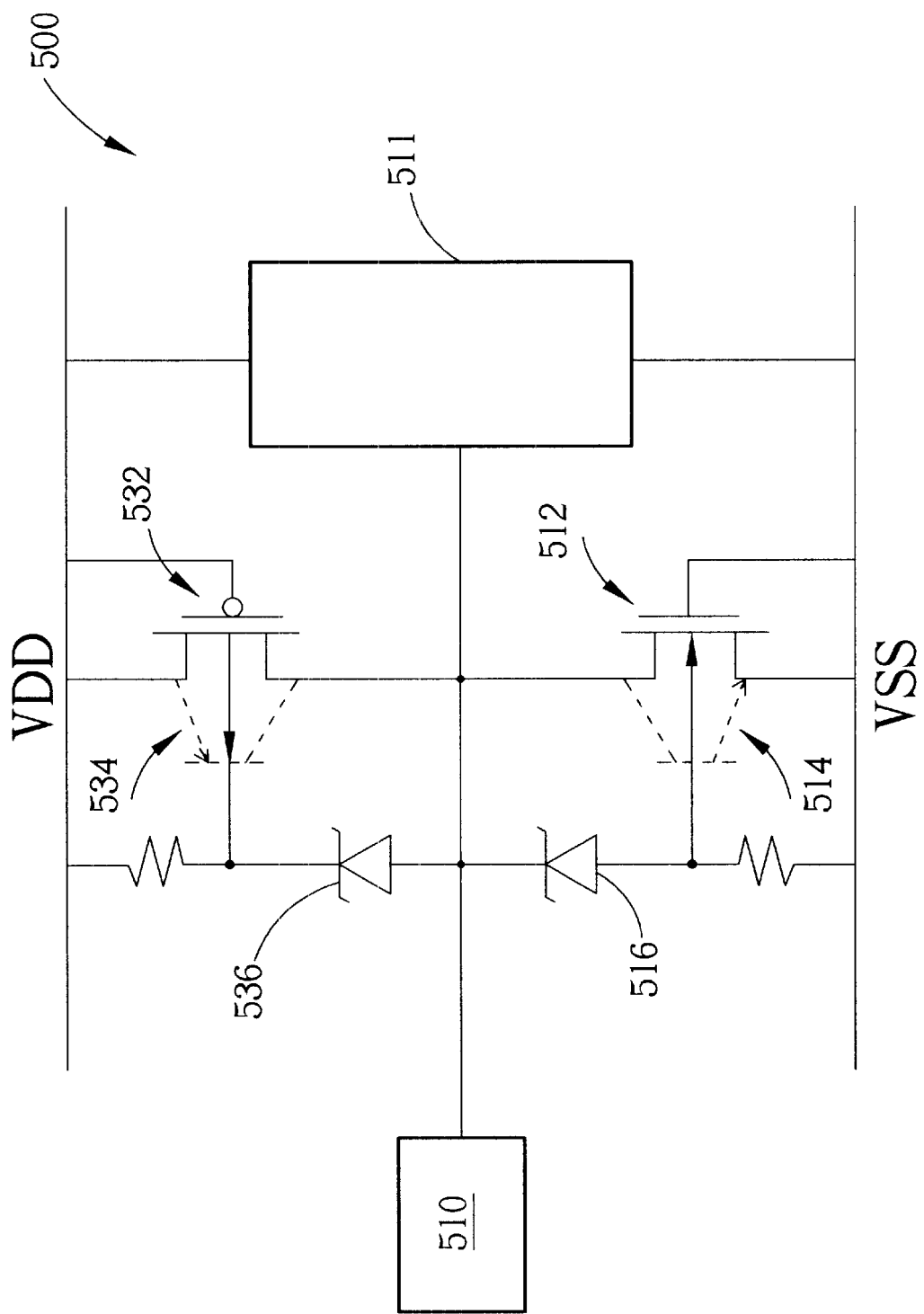
FIG. 14 is a schematic circuit diagram of an input ESD protection circuit designed using a zener diode according to the present invention.
Figure 15:
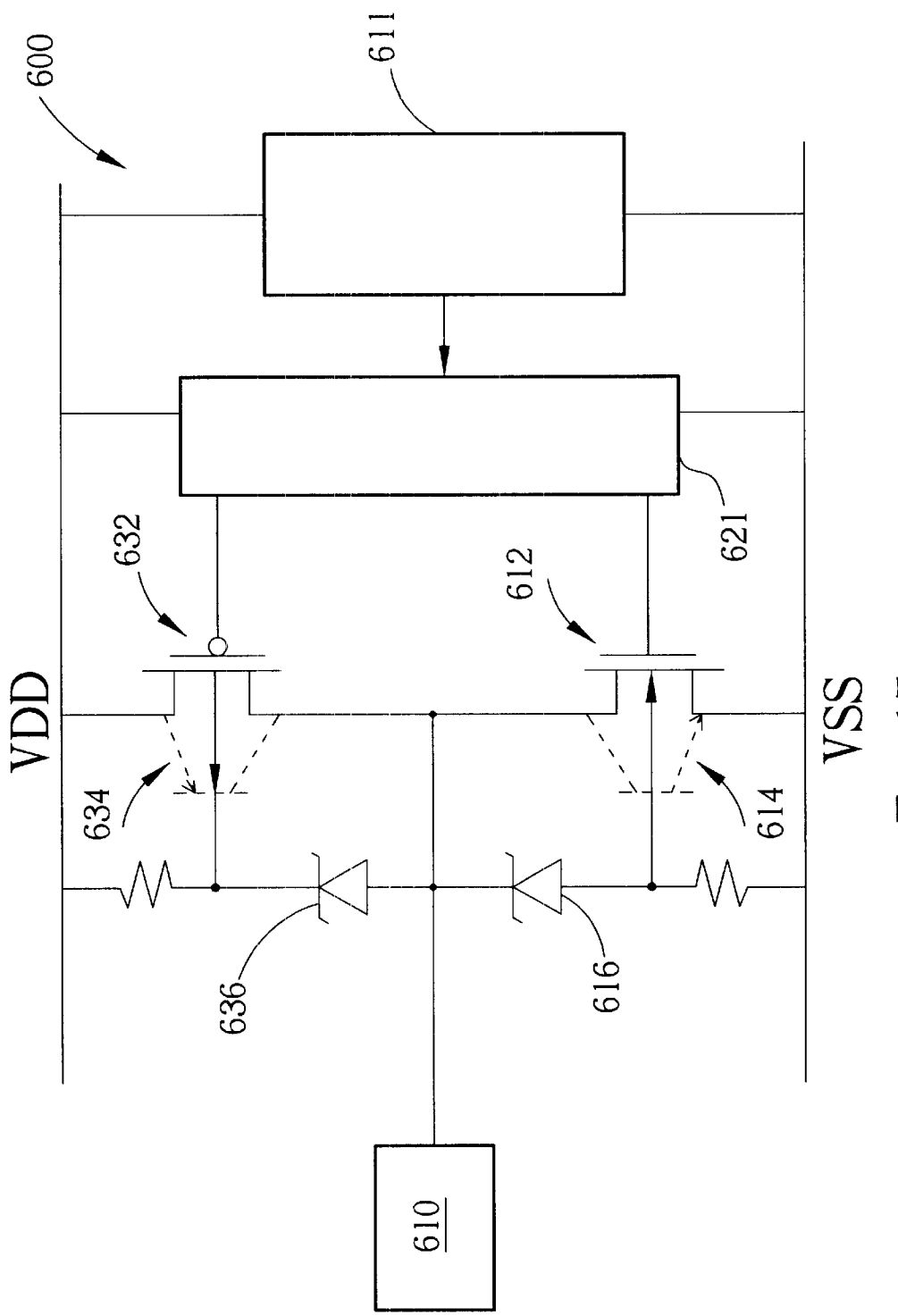
FIG. 15 is a schematic circuit diagram of an output ESD protection circuit designed using a zener diode according to the present invention.

By using the same concept of substrate-triggering, the input and output ESD protection circuits may be designed with zener diodes. Please refer to FIG. 14 and FIG. 15. FIG. 14 is a schematic circuit diagram of an input ESD protection circuit 500 designed with a zener diode according to the present invention. FIG. 15 is a schematic circuit diagram of an output ESD protection circuit 600 designed with a zener diode according to the present invention. As shown in FIG. 14, when a positive-to-$V_{SS}$ ESD zapping occurs on an input pad 510, the $V_{SS}$ power terminal is grounded and the $V_{DD}$ power terminal is floated. The sharply-rising ESD voltage pulse causes breakdown of a zener diode 516. Some of the ESD current is conducted through the zener diode 516 and the P+ diffusion region 100 (in FIG. 7) into the P-type well (P-type substrate) of the ESD protection NMOS 512. The ESD protection NMOS 512 is turned on more quickly to discharge the ESD current from the pad 510 to the $V_{SS}$ power terminal, and so the ESD current will not flow into an internal circuit 511. The substrate-triggered current conducted from the zener diode 516 triggers on a parasitic lateral n-p-n BJT 514 of the ESD protection NMOS 512, pulling current through the substrate (bulk) of the ESD protection NMOS 512, which is far from the surface channel of the ESD protection NMOS 512. The bulk of the ESD protection NMOS 512 has a larger volume to dissipate ESD-generated heat, and therefore the substrate-triggered ESD protection NMOS 512 can sustain a much higher ESD protection level.

When a negative-to-$V_{DD}$ ESD zapping event occurs on the input pad 510, the $V_{DD}$ power terminal is grounded and the $V_{SS}$ power terminal is floated. The sharply-failing negative ESD voltage pulse causes breakdown of the zener diode 536. Some of the ESD current is conducted through the zener diode 536 and the N+ diffusion region 120 (in FIG. 9) into the N-type well of the ESD protection PMOS 532. The ESD protection PMOS 532 is turned on more quickly to discharge the ESD current from the pad 510 to the $V_{DD}$ power terminal. The substrate-triggered current conducted from the zener diode 536 triggers on the parasitic lateral p-n-p BJT 534 of the ESD protection PMOS 532 to pull the current to flow through the substrate (bulk) of the ESD protection PMOS 532, which is far from the surface channel of the ESD protection PMOS 532. The bulk of the ESD protection PMOS 532 has a larger volume to dissipate ESD-generated heat, and therefore the substrate-triggered ESD protection PMOS 532 can sustain a much higher ESD protection level.

As shown in FIG. 15, the output ESD protection circuit 600 is realized by two zener diodes 616, 636, an NMOS 612, a PMOS 632, a parasitic lateral n-p-n BJT 614 of the NMOS 612, and a parasitic lateral p-n-p BJT 634 of the PMOS 632. The output ESD protection circuit 600 is between a pad 610, a pre-driver circuit 621, and an internal circuit 611. The operational principle is the same as that for the input ESD protection circuit 500 in FIG. 14.

Figure 16:
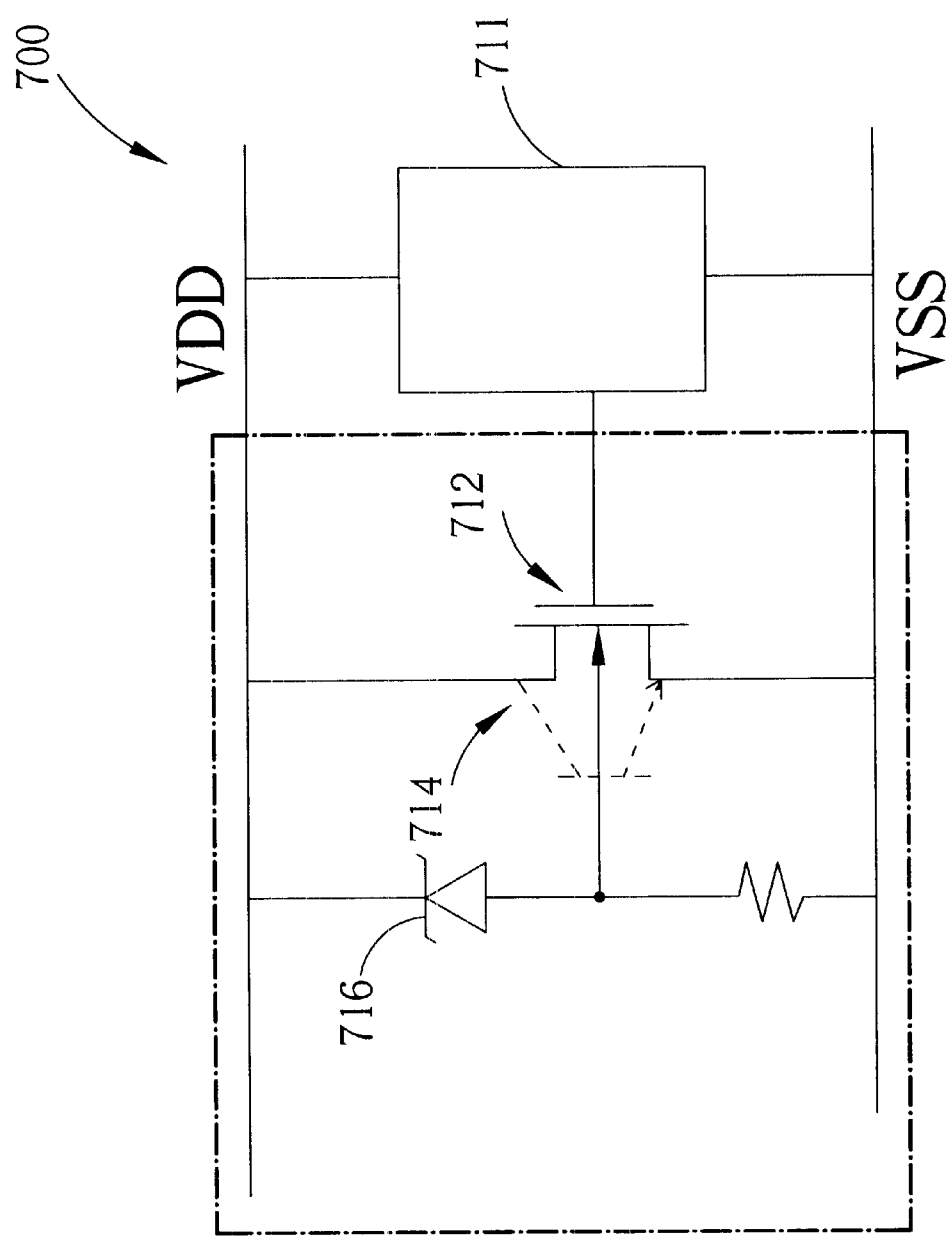
FIG. 16 is a schematic circuit diagram of a power-rail ESD clamp circuit designed using an NMOS according to the present invention.
Figure 17:
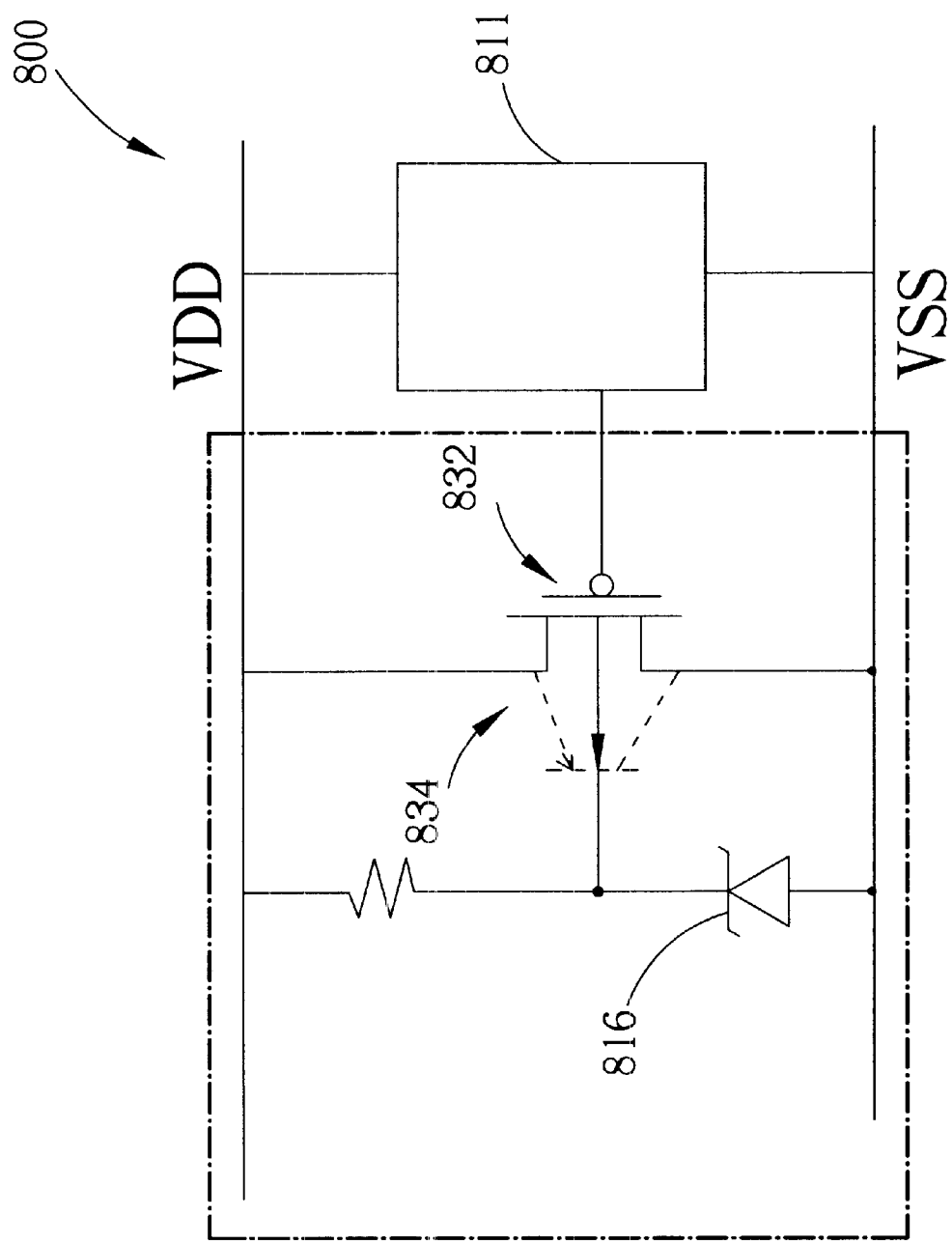
FIG. 17 is a schematic circuit diagram of a power-rail ESD clamp circuit designed using a PMOS according to the present invention.

With the zener diode in the substrate-biasing circuit, the power-rail ESD clamp may be designed with this idea in mind. Please refer to FIG. 16 and FIG. 17. FIG. 16 is a schematic circuit diagram of a power-rail ESD clamp circuit 700 designed with an NMOS according to the present invention. FIG. 17 is a schematic circuit diagram of a power-rail ESD clamp circuit 800 designed with a PMOS according to the present invention. As shown in FIG. 16, under a positive ESD pulse across the $V_{DD}$ and $V_{SS}$ power lines, the $V_{SS}$ power terminal is grounded. The sharply-rising ESD voltage pulse causes breakdown of a zener diode 716. Some ESD current is conducted through the zener diode 716 and the P+ diffusion region (in FIG. 7) into the P-type well (P-type substrate) of the ESD protection NMOS 712. The ESD protection NMOS 712 is turned on more quickly to discharge the ESD current to the $V_{SS}$ power terminal, and so ESD current will not flow into an internal circuit 711. The substrate-triggered current conducted from the zener diode 716 triggers on a parasitic lateral n-p-n BJT 714 of the ESD protection NMOS 712 to pull the current to flow through the substrate (bulk) of the ESD protection NMOS 712, which is far from the surface channel of the ESD protection NMOS 712. The bulk of the ESD protection NMOS 712 has a larger volume to dissipate ESD-generated heat, and therefore the substrate-triggered ESD protection NMOS 712 can sustain a much higher ESD protection level.

As shown in FIG. 17, the power-rail ESD clamp circuit 800 is realized by a zener diode 816, a PMOS 832, and a parasitic lateral p-n-p BJT 834 of the PMOS 832. The operation principle is the same as that for the power-rail ESD clamp circuit 700 in FIG. 16. The ESD voltage pulse causes breakdown of the zener diode 816, and conducts a trigger current through the zener diode 816 and the N+ diffusion 120 (in FIG. 9) into the N-type well (in FIG. 9) of the ESD protection PMOS 832. The parasitic lateral p-n-p BJT 834 of the ESD protection PMOS 832 is thus turned on to discharge the ESD current, and so protect the internal circuit 811.

In summary, the method according to the present invention for making an on-chip ESD protection circuit with improved substrate-triggered effects is to block shallow trench isolation regions between the drain diffusion region and the diffusion region electrically connected to the substrate-biased circuit with an additional dummy gate. Without the shallow trench isolation region, a substrate-trigger current $I_{trig}$ generated from the substrate-biased circuit is more easily conducted to the base of the parasitic lateral BJT in the MOS device structure. Therefore, the parasitic lateral BJT action in the MOS device can be more quickly and effectively triggered on to discharge ESD current. Not only will the ESD current be more quickly discharged through the substrate of the MOS structure, but also the ESD current won't flow through the surface channel of the MOS structure, so as to prevent the MOS device from being burnt-out due to poor heat dissipation.

In contrast to the prior method of making an on-chip ESD protection circuit, the NMOS device structure has a high substrate-triggered effect. The ESD protection device and the ESD protection circuit according to the present invention can be triggered on more quickly and effectively, and therefore the ESD current is discharged more quickly. The present invention method avoids various problems of the traditional ESD protection device and is very suitable for application in sub-quarter-micron CMOS processes.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An NMOS device structure with a high substrate-triggered effect, the NMOS device structure formed on a P-type well in a substrate, the NMOS device structure comprising:
   a gate in the P-type well;
   a first N+ diffusion region in the P-type well for use as a drain of the NMOS device structure;
   a second N+ diffusion region in the P-type well for use as a source of the NMOS device structure, the first N+ diffusion region, the P-type well and the second N+ diffusion region forming a collector, a base and an emitter of a parasitic lateral n-p-n bipolar junction transistor (BJT);
   a first P+ diffusion region in the P-type well for electrically connecting to a P-well biased circuit;

a dummy gate between the first N+ diffusion region and the first P+ diffusion region;

a second P+ diffusion region in the P-type well for electrically connecting to a $V_{SS}$ power terminal; and a shallow trench isolation (STI) structure to isolate the second N+ diffusion region and the second P+ diffusion region;

wherein when the P-well biased circuit induces a substrate trigger current ($I_{trig}$), the substrate trigger current ($I_{trig}$) flows into the P-type well underneath the dummy gate through the first P+ diffusion region, causing the parasitic lateral n-p-n BJT to be turned on and quickly conduct a specific current electrically connected to the drain to the VSS power terminal through the source.

2. The NMOS device structure of claim 1 further comprising a plurality of lightly doped drains (LDD) in the P-type well around each gate.

3. The NMOS device structure of claim 1 wherein the dummy gate of the NMOS device structure comprises P-type dopants and N-type dopants.

4. The NMOS device structure of claim 1 wherein the specific current is an electrostatic discharge (ESD) current.

5. A PMOS device structure with a high substrate-triggered effect, the PMOS device structure formed on an N-type well in a substrate, the PMOS device structure comprising:

a gate in the N-type well;

a first P+ diffusion region in the N-type well for use as a drain of the PMOS device structure;

a second P+ diffusion region in the N-type well for use as a source of the PMOS device structure, the first P+ diffusion region, the N-type well and the second P+ diffusion region forming a collector, a base and an emitter of a parasitic lateral p-n-p bipolar junction transistor (BJT);

a first N+ diffusion region in the N-type well for electrically connecting to an N-well biased circuit;

a dummy gate between the first P+ diffusion region and the first N+ diffusion region;

a second N+ diffusion region in the N-type well for electrically connecting to a $V_{DD}$ power terminal; and a shallow trench isolation (STI) structure to isolate the second P+ diffusion region and the second N+ diffusion region;

wherein when the N-well biased circuit induces a substrate trigger current ($I_{trig}$), the substrate trigger current ($I_{trig}$) flows through the N-type well underneath the dummy gate to the first N region, causing the parasitic lateral p-n-p BJT to be turned on and quickly conduct a specific current electrically connected to the drain to the $V_{DD}$ power terminal through the source.

6. The PMOS device structure of claim 5 wherein the PMOS device structure further comprises a plurality of lightly doped drains (LDD) in the N-type well around each gate.

7. The PMOS device structure of claim 5 wherein the dummy gate of the PMOS device structure comprises P-type dopants and N-type dopants.

8. The PMOS device structure of claim 5 wherein the specific current is an electrostatic discharge (ESD) current.

9. An electrostatic discharge (ESD) protection device disposed on a P-type well of a substrate, the ESD protection device comprising:

at least one NMOS in the P-type well, a drain of the NMOS, the P-type well and a source of the NMOS forming a parasitic lateral n-p-n bipolar junction transistor (BJT), the drain of the NMOS and the source of the NMOS electrically connected to an I/O buffering pad and a $V_{SS}$ power terminal respectively;

at least one first P+ diffusion region in the P-type well for electrically connecting to a P-well biased circuit;

at least one dummy gate between the NMOS and the first P+ diffusion region;

at least one second P+ diffusion region in the P-type well for electrically connecting to a $V_{SS}$ power terminal; and at least one shallow trench isolation (STI) structure to isolate the NMOS and the second P+ diffusion region;

wherein when an ESD voltage pulse is applied to the I/O buffering pad, the P-well biased circuit induces a substrate trigger current ($I_{trig}$), the substrate trigger current ($I_{trig}$) flows into the P-type well underneath the dummy gate through the first P+ diffusion region and reaches a base of the parasitic lateral n-p-n BJT, causing the parasitic lateral n-p-n BJT to be triggered on and quickly discharge a current incurred from the ESD voltage pulse to the $V_{SS}$ power terminal.

10. The ESD protection device of claim 9 wherein the triggered parasitic lateral BJT discharges most of the current incurred from the ESD voltage pulse to the $V_{SS}$ power terminal through the P-type well underneath the NMOS rather than through the surface channel of the NMOS.

11. The ESD protection device structure of claim 9 wherein the dummy gate comprises P-type dopants and N-type dopants.

12. An electrostatic discharge (ESD) protection device, the ESD protection device disposed on an N-type well in a substrate, the ESD protection device comprising:

at least one PMOS in the N-type well, a drain of the PMOS, the N-type well and a source of the PMOS forming a parasitic lateral p-n-p bipolar junction transistor (BJT), the drain of the PMOS and the source of the PMOS electrically connected to an I/O buffering pad and a $V_{DD}$ power terminal respectively;

at least one first N+ diffusion region in the N-type well for electrically connecting to an N-well biased circuit;

at least one dummy gate between the PMOS and the first N+ diffusion region;

at least one second N+ diffusion region in the N-type well for electrically connecting to the $V_{DD}$ power terminal; and at least one shallow trench isolation (STI) structure to isolate the PMOS and the second N+ diffusion region;

wherein when an ESD voltage pulse is applied to the I/O buffering pad, the N-well biased circuit induces a substrate trigger current ($I_{trig}$), the substrate trigger current ($I_{trig}$) flows from the base of the parasitic lateral p-n-p BJT through the N-type well underneath the dummy gate to the first N+ diffusion region, causing the parasitic lateral p-n-p BJT to be triggered on and to quickly discharge a current incurred from the ESD voltage pulse to the $V_{DD}$ power terminal.

13. The ESD protection device of claim 12 wherein the triggered parasitic lateral BJT discharges most of the current incurred from the ESD voltage pulse to the $V_{DD}$ power terminal through the N-type well underneath the PMOS rather than through the surface channel of the PMOS.

14. The ESD protection device of claim 12 wherein the dummy gate comprises P-type dopants and N-type dopants.

15. An electrostatic discharge (ESD) protection circuit electrically connected to an I/O buffering pad, an internal circuit, a $V_{SS}$ power terminal and a $V_{DD}$ power terminal, the ESD protection circuit comprising:

a first ESD protection device electrically connected to the $V_{SS}$ power terminal, the I/O buffering pad and the internal circuit, the first ESD protection device comprising:

a P-type well;

at least one first NMOS in the P-type well, a drain of the first NMOS, the P-type well and a source of the first NMOS forming a parasitic lateral n-p-n bipolar junction transistor (BJT), the drain of the first NMOS and the source of the NMOS electrically connected to the I/O buffering pad and the $V_{SS}$ power terminal respectively;

at least one first P+ diffusion region in the P-type well;

at least one dummy gate between the first NMOS and the first P+ diffusion region;

at least one second P+ diffusion region in the P-type well for electrically connecting to the $V_{SS}$ power terminal; and at least one first shallow trench isolation (STI) structure for isolating the first NMOS and the second P+ diffusion region;

a positive substrate-biased circuit electrically connected to the $V_{SS}$ power terminal, the I/O buffering pad, the internal circuit and the first P+ diffusion region in the first ESD protection device, the positive substrate-biased circuit comprising:

a second NMOS, a source of the second NMOS electrically connected to the $V_{SS}$ power terminal via a P-type well resistor (R_PW), a drain of the second NMOS electrically connected to the I/O buffering pad, a gate of the second NMOS electrically connected to the $V_{SS}$ power terminal and the I/O buffering pad via a first electrical device and a second electrical device respectively;

a second ESD protection device structure electrically connected to the $V_{DD}$ power terminal, the I/O buffering pad and the internal circuit, the second ESD protection device structure comprising:

an N-type well;

at least one first PMOS in the N-type well, a drain of the first PMOS, the N-type well and a source of the first PMOS forming a parasitic lateral p-n-p bipolar junction transistor (BJT), the drain of the first PMOS and the source of the first PMOS electrically connected to the I/O buffering pad and the $V_{DD}$ power terminal respectively;

at least one first N+ diffusion region in the N-type well;

at least one dummy gate between the first PMOS and the first N+ diffusion region;

at least one second N+ diffusion region in the N-type well for electrically connecting to the $V_{DD}$ power terminal; and at least one first shallow trench isolation (STI) structure for isolating the first PMOS and the second N+ diffusion region;

a negative substrate-biased circuit electrically connected to the $V_{DD}$ power terminal, the I/O buffering pad, the internal circuit and the first N+ diffusion region in the second ESD protection device, the negative substrate-biased circuit comprising:

a second PMOS, a source of the second PMOS electrically connected to the $V_{DD}$ power terminal via an N-type well resistor (R_NW), a drain of the second PMOS electrically connected to the I/O buffering pad, a gate of the second PMOS electrically connected to the $V_{DD}$ power terminal and the I/O buffering pad via a third electrical device and a fourth electrical device respectively.

16. The ESD protection circuit of claim 15 wherein when a positive ESD voltage pulse is applied to the I/O buffering pad, the $V_{SS}$ power terminal is grounded and the $V_{DD}$ power terminal is floated, the positive ESD voltage pulse exerting a coupling voltage on the gate of the second NMOS through the second electrical device and the first electrical device.

17. The ESD protection circuit of claim 16 wherein when the coupling voltage is greater than a threshold voltage (Vth) of the second NMOS, the second NMOS turns on and conducts some current incurred from the positive ESD voltage pulse to the P-type well through the first P+ diffusion region, causing the n-p-n BJT to be triggered on, and the current incurred from the positive ESD voltage pulse is quickly discharged to the $V_{SS}$ power terminal through the P-type well underneath the first NMOS.

18. The ESD protection circuit of claim 15 wherein when a negative ESD voltage pulse is applied to the I/O buffering pad, the $V_{SS}$ power terminal is grounded the $V_{DD}$ power terminal is floated, a current incurred from the negative ESD voltage pulse is discharged to the $V_{SS}$ power terminal through a forward biased junction formed by the drain of the first NMOS and the P-type well.

19. The ESD protection circuit of claim 15 wherein when a negative ESD voltage pulse is applied to the I/O buffering pad, the $V_{DD}$ power terminal is grounded and the $V_{SS}$ power terminal is floated, the negative ESD voltage pulse exerts a coupling voltage to the gate of the second PMOS through the third electrical device and the fourth electrical device.

20. The ESD protection circuit of claim 19 wherein when the coupling voltage is less than a threshold voltage (Vth) of the second PMOS, the second PMOS turns on and conducts some current incurred from the negative ESD voltage pulse to the N-type well through the first N+ diffusion region, causing the p-n-p BJT to be triggered on, and the current incurred from the ESD voltage pulse is quickly discharged to the $V_{DD}$ power terminal through the N-type well underneath the first PMOS.

21. The ESD protection circuit of claim 15 wherein when a positive ESD voltage pulse is applied to the I/O buffering pad, the $V_{DD}$ power terminal is grounded and the $V_{SS}$ power terminal is floated, a current incurred from the positive ESD voltage pulse is discharged to the $V_{DD}$ power terminal through a forward biased junction formed by the drain of the first PMOS and the N-type well.

22. The ESD protection circuit of claim 15 wherein the first electrical device comprises a resistor or a diode.

23. The ESD protection circuit of claim 15 wherein the second electrical device comprises a resistor, a capacitor, or a zener diode.

24. The ESD protection circuit of claim 15 wherein the third electrical device comprises a resistor, a capacitor or a zener diode.

25. The ESD protection circuit of claim 15 wherein the fourth electrical device comprises a resistor or a diode.

26. The ESD protection circuit of claim 15 wherein the ESD protection circuit further comprises a pre-driver circuit electrically connected to the $V_{DD}$ power terminal, the $V_{SS}$ power terminal, the internal circuit, the gate of the first NMOS and the gate of the first PMOS.

27. An electrostatic discharge (ESD) protection circuit electrically connected to an I/O buffering pad, an internal circuit, a $V_{SS}$ power terminal, and a $V_{DD}$ power terminal, the ESD protection circuit comprising:

a first ESD protection device electrically connected to the $V_{SS}$ power terminal, the I/O buffering pad and the internal circuit, the first ESD protection device structure comprising:
  a P-type well;
  at least one NMOS in the P-type well, a drain of the NMOS, the P-type well, and a source of the NMOS forming a parasitic lateral n-p-n bipolar junction transistor (BJT), the drain of the NMOS and the source of the NMOS electrically connected to the I/O buffering pad and the $V_{SS}$ power terminal, respectively;
  at least one first P+ diffusion region in the P-type well;
  at least one dummy gate between the NMOS and the first P+ diffusion region;
  at least one second P+ diffusion region in the P-type well for electrically connecting to the $V_{SS}$ power terminal; and
  at least one first shallow trench isolation (STI) structure for isolating the NMOS and the second P+ diffusion region;
a positive substrate-biased circuit electrically connected to the $V_{SS}$ power terminal, the I/O buffering pad, the internal circuit, and the first P+ diffusion region in the first ESD protection device, the positive substrate-biased circuit comprising:
  a first electrical device electrically connected to the I/O buffering pad, the internal circuit, and the first P+ diffusion region in the first ESD protection device structure;
  a second electrical device electrically connected to the $V_{SS}$ power terminal and the first P+ diffusion region in the first ESD protection device structure; a second ESD protection device structure electrically connected to the $V_{DD}$ power terminal, the I/O buffering pad, and the internal circuit, the second ESD protection device structure comprising:
  an N-type well;
  at least one PMOS in the N-type well, a drain of the PMOS, the N-type well and a source of the PMOS forming a parasitic lateral p-n-p bipolar junction transistor (BJT), the drain of the PMOS and the source of the PMOS electrically connected to the I/O buffering pad and the $V_{DD}$ power terminal, respectively;
  at least one first N+ diffusion region in the N-type well;
  at least one dummy gate between the PMOS and the first N+ diffusion region;
  at least one second N+ diffusion region in the N-type well for electrically connecting to the $V_{DD}$ power terminal; and
  at least one second shallow trench isolation (STI) structure for isolating the PMOS and the second N+ diffusion region;
a negative substrate-biased circuit electrically connected to the $V_{DD}$ power terminal, the I/O buffering pad, the internal circuit, and the first N+ diffusion region in the second ESD protection device, the negative substrate-biased circuit comprising:
  a third electrical device electrically connected to the I/O buffering pad, the internal circuit, and the first N+ diffusion region in the second ESD protection device structure; and
  a fourth electrical device electrically connected the $V_{DD}$ power terminal and the first N+ diffusion region in the second ESD protection device structure.

28. The ESD protection circuit of claim 27 wherein when a positive ESD voltage pulse is applied to the I/O buffering pad, the $V_{SS}$ power terminal is grounded and the $V_{DD}$ power terminal is floated, the positive ESD voltage pulse generates a coupling voltage on the P-type well through the first P+ diffusion region by the second electrical device and the first electrical device, causing the parasitic lateral n-p-n BJT to be triggered on, and current incurred from the ESD voltage pulse is quickly discharged to the $V_{SS}$ power terminal through the P-type well underneath the NMOS.

29. The ESD protection circuit of claim 27 wherein when a negative ESD voltage pulse is applied to the I/O buffering pad, the $V_{SS}$ power terminal is grounded and the $V_{DD}$ power terminal is floated, a current incurred from the negative ESD voltage pulse is discharged to the $V_{SS}$ power terminal through a forward biased junction formed by the drain of the first NMOS and the P-type well.

30. The ESD protection circuit of claim 27 wherein when a negative ESD voltage pulse is applied to the I/O buffering pad, the $V_{DD}$ power terminal is grounded and the $V_{SS}$ power terminal is floated, the negative ESD voltage pulse generates a coupling voltage on the N-type well through the first N+ diffusion region by the third electrical device and the fourth electrical device, causing the parasitic lateral p-n-p BJT to be triggered on, and a current incurred from the negative ESD voltage pulse is quickly discharged to the $V_{DD}$ power terminal through the N-type well underneath the PMOS.

31. The ESD protection circuit of claim 27 wherein when a positive ESD voltage pulse is applied to the I/O buffering pad, the $V_{DD}$ power terminal is grounded the $V_{SS}$ power terminal is floated, and a current incurred from the positive ESD voltage pulse is discharged to the $V_{DD}$ power terminal through a forward biased junction formed by the drain of the first PMOS and the N-type well.

32. The ESD protection circuit of claim 27 wherein the first electrical device comprises a resistor or a diode.

33. The ESD protection circuit of claim 27 wherein the second electrical device comprises a resistor, a capacitor, or a zener diode.

34. The ESD protection circuit of claim 27 wherein the third electrical device comprises a resistor, a capacitor, or a zener diode.

35. The ESD protection circuit of claim 27 wherein the fourth electrical device comprises a resistor or a diode.

36. The ESD protection circuit of claim 27 wherein the ESD protection circuit further comprises a pre-driver circuit electrically connected to the $V_{DD}$ power terminal, the $V_{SS}$ power terminal, the internal circuit, the gate of the first NMOS, and the gate of the first PMOS.

37. A power-rail electrostatic discharge (ESD) clamp circuit electrically connected to a $V_{SS}$ power terminal and a VDD power terminal, the power-rail ESD clamp circuit comprising:
  an ESD protection device, the ESD protection device comprising:
  a P-type well;
  an NMOS in the P-type well, a drain of the NMOS, the P type well, and a source of the NMOS forming a parasitic lateral n-p-n bipolar junction transistor (BJT), the drain of the first NMOS and the source of the NMOS electrically connected to the $V_{DD}$ power terminal and the $V_{SS}$ power terminal, respectively;
  at first P+ diffusion region in the P-type well;
  a dummy gate between the first NMOS and the first P+ diffusion region;
  a second P+ diffusion region in the P-type well for electrically connecting to the $V_{SS}$ power terminal; and a first shallow trench isolation (STI) structure for isolating the first NMOS and the second P+ diffusion region;

a substrate-biased circuit electrically connected to the $V_{SS}$ power terminal, the $V_{DD}$ power terminal, and the first P+ diffusion region in the ESD protection device, the substrate-biased circuit comprising:

a MOS, a source of the MOS electrically connected to the $V_{SS}$ power terminal via a P-type well resistor (R_PW), a drain of the MOS electrically connected to the $V_{DD}$ power terminal, a gate of the MOS electrically connected to the $V_{SS}$ power terminal and the $V_{DD}$ power terminal via a first electrical device and a second electrical device, respectively.

38. The power-rail ESD clamp circuit of claim 37 wherein the MOS is an NMOS, and the first electrical device and the second electrical device are a resistor and a capacitor, respectively.

39. The power-rail ESD clamp circuit of claim 37 wherein the MOS is a PMOS, and the first electrical device and the second electrical device are a diode and a resistor, respectively.

40. A power-rail electrostatic discharge (ESD) clamp circuit electrically connected to a $V_{SS}$ power terminal and a $V_{DD}$ power terminal, the power-rail ESD clamp circuit comprising:

an ESD protection device, the ESD protection device comprising:

a P-type well;

an NMOS in the P-type well, a drain of the NMOS, the P-type well, and a source of the NMOS forming a parasitic lateral n-p-n bipolar junction transistor (BJT), the drain of the NMOS and the source of the NMOS electrically connected to the $V_{DD}$ power terminal and the $V_{SS}$ power terminal, respectively;

a first P+ diffusion region in the P-type well;

a dummy gate between the NMOS and the first P+ diffusion region;

a second P+ diffusion region in the P-type well for electrically connecting to the $V_{SS}$ power terminal; and a first shallow trench isolation (STI) structure for isolating the NMOS and the second P+ diffusion region;

a substrate-biased circuit electrically connected to the $V_{SS}$ power terminal, the $V_{DD}$ power terminal, and the first P+ diffusion region in the ESD protection device structure, the substrate-biased circuit comprising:

a resistor electrically connected to the $V_{SS}$ power terminal and the first P+ diffusion region in the ESD protection device; and a zener diode electrically connected to the $V_{DD}$ power terminal, the resistor, and the first P+ diffusion region of the first ESD protection device.

* * * * *